United States Patent
Rhodes et al.

(10) Patent No.: US 6,884,692 B2
(45) Date of Patent: Apr. 26, 2005

(54) METHOD FOR FORMING CONDUCTIVE MATERIAL IN OPENING AND STRUCTURES REGARDING SAME

(75) Inventors: Howard E. Rhodes, Boise, ID (US); Richard H. Lane, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/230,887

(22) Filed: Aug. 29, 2002

(65) Prior Publication Data

US 2004/0043619 A1 Mar. 4, 2004

(51) Int. Cl.⁷ .............................................. H01L 21/20
(52) U.S. Cl. ...................... 438/399; 438/396; 438/253; 438/256
(58) Field of Search ................... 438/396, 253, 438/399, 256, 240; 257/306

(56) References Cited

U.S. PATENT DOCUMENTS

| | | | |
|---|---|---|---|
| 5,162,248 A | * | 11/1992 | Dennison et al. |
| 5,270,241 A | | 12/1993 | Dennison et al. |
| 5,392,189 A | | 2/1995 | Fazan et al. |
| 5,670,425 A | | 9/1997 | Schinella et al. |
| 5,760,434 A | | 6/1998 | Zahurak et al. |
| 5,998,257 A | | 12/1999 | Lane et al. |
| 6,046,093 A | * | 4/2000 | DeBoer et al. ............. 438/398 |
| 6,090,655 A | | 7/2000 | Zahurak et al. |
| 6,175,146 B1 | | 1/2001 | Lane et al. |
| 6,238,968 B1 | * | 5/2001 | Yu et al. .................... 438/253 |
| 6,261,899 B1 | | 7/2001 | Lane et al. |
| 6,265,262 B1 | * | 7/2001 | Okuno et al. .............. 438/253 |
| 6,281,070 B1 | | 8/2001 | Lane et al. |
| 6,424,043 B1 | | 7/2002 | Lane et al. |
| 6,436,786 B1 | * | 8/2002 | Tsuzumitani et al. ....... 438/396 |
| 6,455,370 B1 | * | 9/2002 | Lane ........................ 438/253 |
| 6,492,241 B1 | | 12/2002 | Rhodes et al. |
| 6,495,410 B1 | | 12/2002 | Lane et al. |
| 2001/0007796 A1 | | 7/2001 | Hudson et al. |

FOREIGN PATENT DOCUMENTS

EP  0 980 100 A2  2/2000

* cited by examiner

*Primary Examiner*—Amir Zarabian
*Assistant Examiner*—Christy Novacek
(74) *Attorney, Agent, or Firm*—Mueting, Raasch and Gebhardt, P.A.

(57) ABSTRACT

Method and structure use support layers to assist in, for example, planarization processes to form conductive materials (e.g., a Group VIII metal) in an opening. Further, for example, such method and structure may use a Group VIII metal as an etch stop or end point for the planarization process with subsequent etching to remove undesired portions of the Group VIII metal.

71 Claims, 14 Drawing Sheets

METHOD FOR FORMING CONDUCTIVE MATERIAL IN OPENING AND STRUCTURES REGARDING SAME

FIELD OF THE INVENTION

The present invention relates to the fabrication of integrated circuits. More particularly, the present invention relates to the formation of conductive material within an opening, e.g., a container such as used in the formation of container-type capacitors, a contact hole, etc.

BACKGROUND OF THE INVENTION

In the fabrication of integrated circuits, various layers, e.g., conductive layers and insulative layers, are used. For example, during the formation of semiconductor devices, such as dynamic random access memories (DRAMs), insulating layers are used to electrically separate conductive layers such as doped polycrystalline silicon, aluminum, metal silicides, etc. It is often required that the conductive layers be interconnected through holes or openings in the insulating layer. Such holes are commonly referred to as contact holes, e.g., when the hole extends through an insulating layer to an active device area, or vias, e.g., when the hole extends through an insulating layer between two conductive layers. The profile of an opening is of particular importance such that specific characteristics can be achieved when a contact hole or via is provided or filled with one or more conductive materials, e.g., conductive barrier layers.

Conductive materials are also formed in openings when providing certain storage cell capacitors for use in semiconductor devices, e.g., DRAMs. Storage capacity and size are important characteristics of a storage cell. Generally, a storage cell capacitor is formed with a dielectric constant material interposed between two conductive electrodes. One or more layers of various conductive materials may be used as the electrode material. For example, one or more Group VIII metals, such as rhodium or platinum, may be used for the electrode material.

Many storage cell capacitors are formed by processes including high aspect ratio openings. For example, container-type capacitors are described in U.S. Pat. No. 5,392,189 to Fazan, et al., entitled "Capacitor Compatible With High Dielectric Constant Materials Having Two Independent Insulative Layers and the Method for Forming Same," issued Feb. 21, 1995, and also in U.S. Pat. No. 5,270,241 to Dennison, et al., entitled "Optimized Container Stacked Capacitor DRAM Cell Utilizing Sacrificial Oxide Deposition and Chemical Mechanical Polishing," issued 14, Dec. 1993. In such references, methods for forming container-type cell capacitor structures are described which generally include the formation of an insulative layer over existing topography and then etching openings into the insulative layer allowing access to the underlying topography, e.g., for a cell capacitor, the underlying topography may include conductive regions (e.g., conductive plugs). Thereafter, a conductive layer (e.g., polysilicon) to be used for forming the bottom electrode of the cell capacitor is formed within the openings, e.g., on the bottom surface and side walls of the openings, and is also formed on the upper surface of the insulative layer in which the opening has been defined. In one illustrative process described in the references, a layer of oxide material is formed over the polysilicon to a thickness enough to completely fill the polysilicon-lined openings. Thereafter, this oxide material is removed down to the polysilicon, preferably by chemical mechanical planarization (CMP) which selectively stops on the upper exposed regions of the polysilicon. Thereafter, the upper portions of the polysilicon are removed to separate neighboring polysilicon structures, thereby forming individual containers (e.g., contact openings lined with the polysilicon and filled with oxide material) and exposed insulative material between such containers. Thereafter, the oxide material still filling the opening over the polysilicon is removed, leaving the opening lined with a polysilicon bottom electrode for use in forming the container-type cell capacitor.

Storage capacity and size are important characteristics in a storage cell. One way to retain the storage capacity of a device and decrease its size is to increase the dielectric constant of the dielectric layer of the storage cell capacitor. Therefore, preferably a high dielectric constant material is used in applications interposed between two electrodes. Group VIII metals such as platinum, rhodium, iridium, ruthenium, and osmium, also sometimes referred to as noble metals, are desirable electrode materials for such high dielectric constant capacitors. Therefore, it is desirable to form the Group VIII metals or their alloys in openings as described above.

However, Group VIII metals, such as platinum or platinum alloys such as platinum-rhodium, are not easily planarized. For example, an illustrative planarization problem associated with the use of a Group VIII metal is shown in FIG. 1A. FIG. 1A shows a substrate assembly 10 including a lower portion 11 and an insulative layer 12 formed thereon. An opening 15 is defined in the insulative layer 12 to the lower portion 11 of the substrate assembly 10. To form a lower electrode or bottom electrode of a container-type capacitor structure, a Group VIII metal layer 13, such as platinum, is formed over the insulative layer and as a lining in opening 15. A photoresist layer 14 is formed over the Group VIII metal layer 13 to completely fill the opening 15. Upon planarization, the upper region of layer 14 is removed along with the Group VIII metal portion 13 outside of opening 15, resulting in the non-dashed lining 17. However, problematically, the Group VIII metal, such as platinum, is deformed at the upper region of the opening 15. As shown in FIG. 1A, the platinum material is pushed into the center of the container opening 15 as represented by the projections 16 during planarization. Such deformation of the platinum layer in the container opening 15 produces an undesirable profile and is further problematic for removing the resist 14 from within the opening 15. In addition, the platinum material can be smeared across the entire container making it difficult to complete the formation of a container capacitor.

As shown in FIG. 1B, a method of using a Group VIII metal layer is shown wherein the metal layer 23 is not planarized but rather etched. For example, as shown in FIG. 1B, the substrate assembly 20 includes a lower portion 21 having insulative layer 22 formed thereover. An opening 25 is defined in the insulative layer 22 with a Group VIII metal layer 23 formed over the insulative layer 22 and conformally lining the opening 25. Thereafter, photoresist material 24 is formed over the structure and within the opening 25. However, as opposed to planarizing the photoresist material 24 and the metal layer 23 to the upper surface of the insulative layer 22, planarization is only used to remove the resist material to the upper surface of the metal layer 23. Thereafter, an etch is used to remove the Group VIII metal layer 23, e.g., a platinum layer. However, upon wet etching the platinum material 23 back to the insulative layer 22, the resist material 24 is pulled back away from the platinum conductive layer 23 allowing for undesirable removal of portions of the platinum as shown by the undesirably etched regions 26 in FIG. 1B.

As described above, planarization problems are clearly apparent in the formation of Group VIII metal layers within openings, e.g., formation of bottom electrodes of container-type cell capacitor structures. Such problems are also applicable when forming conductive layers within openings for other applications, e.g., contact applications, via structures, etc.

SUMMARY OF THE INVENTION

To overcome the problems described above, e.g., those related to the planarization of Group VIII metals, various methods and structures are provided in the detailed description below. Many of the methods use support layers to assist in the planarization process or use a Group VIII metal material as an etch stop or end point for the planarization process with a subsequent etching step to remove unwanted portions of the Group VIII metal material formed in the various processes.

A method of providing a conductive material in an opening according to the present invention includes providing a substrate assembly having at least one surface and providing an opening defined through the surface of the substrate assembly. The opening is defined by at least one surface. At least one conductive material (e.g., at least one Group VIII metal such platinum and rhodium) is formed within the opening on the at least one surface defining the opening and on at least a portion of the substrate assembly surface. A support film (e.g., an oxide material) is formed over the conductive material and a fill material (e.g., a resist material) is formed over at least a portion of the support film. The fill material at least fills the opening. Thereafter, at least the fill material outside of the opening is removed by planarization. The support film outside of the opening, the at least one conductive material outside of the opening, the fill material within the opening, and the support film within the opening are then removed.

In one embodiment of the method, the support film outside of the opening and the conductive material outside of the opening are also removed to at least the surface of the substrate assembly by planarization.

In another embodiment of the method, the support film outside of the opening is also removed by planarization and the conductive material outside of the opening is removed to at least the surface of the substrate assembly by wet etching and/or dry etching.

In another embodiment of the method, the support film outside of the opening is removed by dry etching, and further the conductive material outside of the opening is removed to at least the surface of the substrate assembly by wet etching and/or dry etching.

In yet another embodiment of the method, the support film outside of the opening is removed by wet etching, and further the conductive material outside of the opening is removed to at least the surface of the substrate assembly by wet etching and/or dry etching.

Another method of providing a conductive material in an opening according to the present invention includes providing a substrate assembly having at least one surface and providing an opening defined through the surface of the substrate assembly. The opening is defined by at least one surface. At least one conductive material is formed within the opening on the at least one surface defining the opening and on at least a portion of the substrate assembly surface. At least one support material is formed over the at least one conductive material and at least the support material and the at least one conductive material outside of the opening is removed to at least the substrate assembly surface by planarization. Thereafter, the support material within the opening is removed.

In one embodiment of the method, forming the support material includes forming a support film over the at least one conductive material and forming a fill material over at least a portion of the support film. The fill material at least fills the opening. Further, at least the fill material outside of the opening, the support film outside of the opening and the at least one conductive material outside of the opening is planarized to at least the substrate assembly surface.

In another method of providing a conductive material in an opening according to the present invention, the method includes providing a substrate assembly having at least one surface and providing an opening defined through the surface of the substrate assembly. The opening is defined by at least one surface. At least one conductive material is formed within the opening on the at least one surface defining the opening and on at least a portion of the substrate assembly surface. At least a support material is formed over the at least one conductive material. At least the support material outside of the opening is removed to the at least one conductive material by planarization. Thereafter, the at least one conductive material outside the opening and the support material within the opening are removed.

In one embodiment of the method, forming the support material includes forming a support film over the at least one conductive material. The support film outside the opening is planarized to the at least one conductive material. Further, the at least one conductive material outside the opening is removed to at least the substrate assembly surface using a wet etch and/or dry etch.

In yet another embodiment of the method, the support material at least fills the opening and the at least one conductive material outside the opening is removed to at least the substrate assembly surface using a wet etch and/or a dry etch.

Another method of providing a conductive material in an opening according to the present invention is described. The method includes providing a substrate assembly having at least an upper surface and providing an opening defined through the upper surface of the substrate assembly. The opening is defined by at least one surface. A stack of at least one conductive material, a support film, and a fill material is formed within the opening and on at least a portion of the upper surface. The opening is entirely filled by the stack. At least the fill material outside of the opening is removed followed by the removal of the support film outside of the opening, the removal of the conductive material outside of the opening, the removal of the fill material within the opening, and the removal of the support film within the opening.

In one embodiment of the method, the support film and the at least one conductive material outside of the opening is removed to at least the surface of the substrate assembly by planarization.

In yet another embodiment, the support film outside of the opening is removed by planarization, and further the at least one conductive material outside of the opening is removed to at least the upper surface of the substrate assembly by a wet etch and/or a dry etch.

Yet further, in another embodiment, the support film outside of the opening is dry etched, and further a wet etch and/or a dry etch is used to remove the at least one conductive material outside of the opening to at least the upper surface of the substrate assembly.

Yet further, in another embodiment, the support film is wet etched, and further a wet etch and/or a dry etch is used to remove the at least one conductive material outside of the opening to at least the upper surface of the substrate assembly.

In many embodiments of the methods described above, the fill material within the opening is removed using a wet etch and/or a dry etch, the fill material is formed of a material that is removed at a rate faster than material at the surface of the substrate assembly during removal of the fill material by the wet etch and/or the dry etch, the support film within the opening is removed using a wet etch and/or a dry etch, and/or the support film is formed of a material that is removed at a rate faster than material at the surface of the substrate assembly during removal of the support film by the wet etch and/or the dry etch.

The methods described above may be used to form a first electrode on the bottom surface and the at least one side wall of a defined opening. Thereafter, a dielectric material may be provided on at least a portion of the first electrode and a second electrode may be provided on at least a portion of the dielectric material.

A structure for use in providing a conductive material in a opening according to the present invention includes a substrate assembly (e.g., an assembly having an insulative material at the surface) including an opening defined through an upper surface thereof. The opening is defined by at least one surface. At least one conductive material (e.g., a Group VIII metal such as platinum and/or metal rhodium) is formed on the at least one surface defining the opening and at least a portion of the upper surface of the substrate assembly. A support film (e.g., an oxide material) is formed over the at least one conductive material and a fill material (e.g., a resist material) is formed over at least a portion of the support film. The fill material at least fills the opening.

In one embodiment of the structure, the support film is formed of a material that is removed at a rate faster than the material at the upper surface of the substrate assembly when subjected to a predetermined etch.

In another embodiment of the structure, the fill material is formed of a material that is removed at a rate faster than the material at the upper surface of the substrate assembly when subjected to a predetermined etch process.

In yet another embodiment, the conductive material is formed only within the opening on a bottom surface and at least one side wall defining the opening, the support film is formed only within the opening over the at least one conductive material, and further the fill material is formed only within the opening.

The above summary of the present invention is not intended to describe each embodiment of every implementation of the present invention. Advantages, together with a more complete understanding of the invention, will become apparent and appreciated by referring to the following detailed description and claims taken in conjunction with the accompanying drawings.

BRIEF DESCRIPTION OF THE DRAWINGS

The present invention will be better understood from reading the following description of illustrative embodiments with reference to the attached drawings, wherein below.

DETAILED DESCRIPTION OF THE EMBODIMENTS

Various alternate methods and structures according to the present invention shall be described generally with reference to FIGS. 2–7. Thereafter, embodiments and illustrations of applications using one or more of the methods according to the present invention shall be described with reference to FIGS. 8A–8B and FIGS. 9A–9B. It will be apparent to one skilled in the art that scaling in the figures does not represent precise dimensions of the various elements illustrated therein.

Figure 2A:
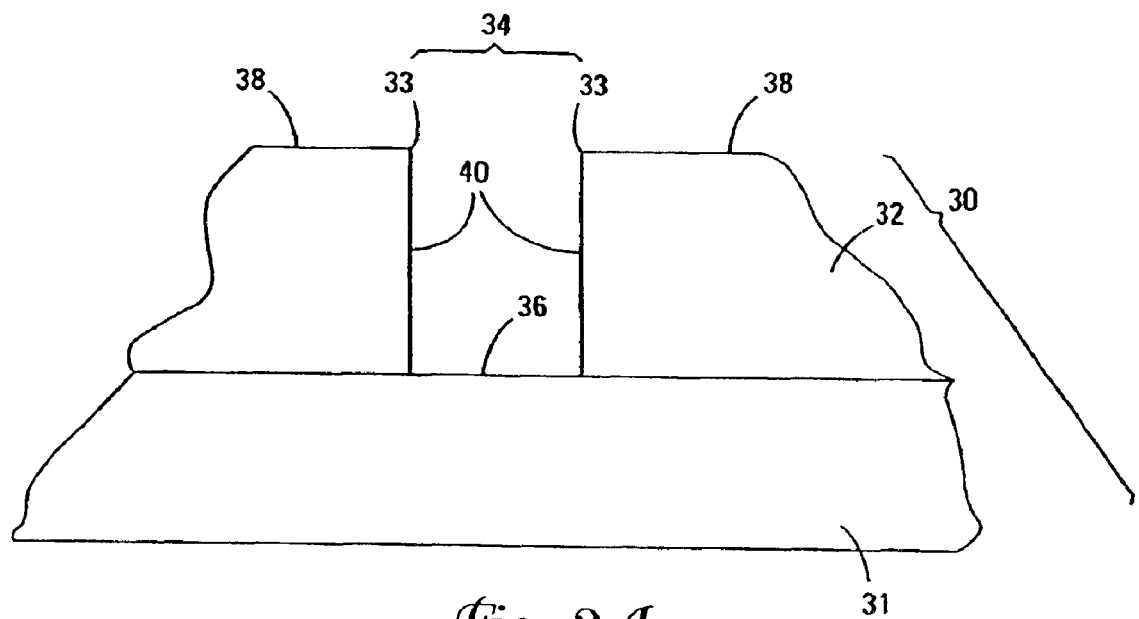
FIGS. 2A–2E illustrate one illustrative method of forming a conductive material, e.g., platinum, in an opening, according to the present invention.
Figure 2B:
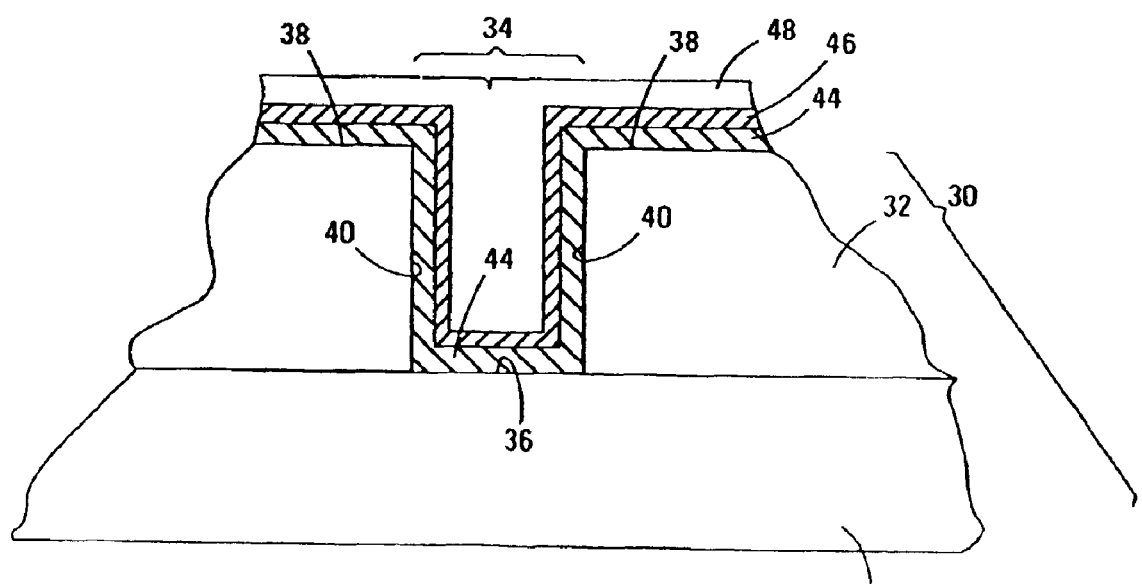
Figure 2C:
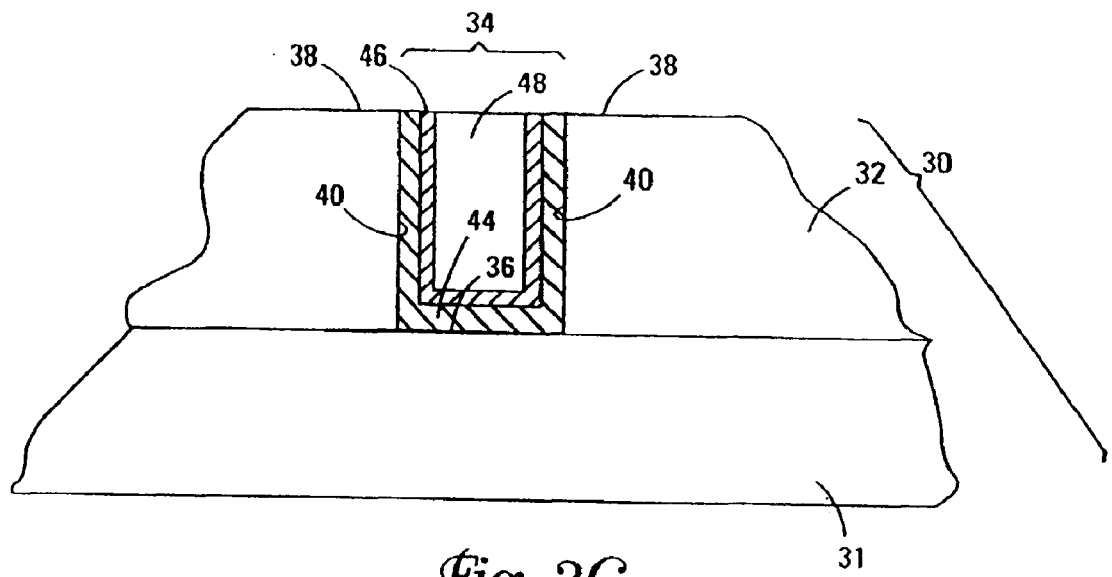
Figure 2D:
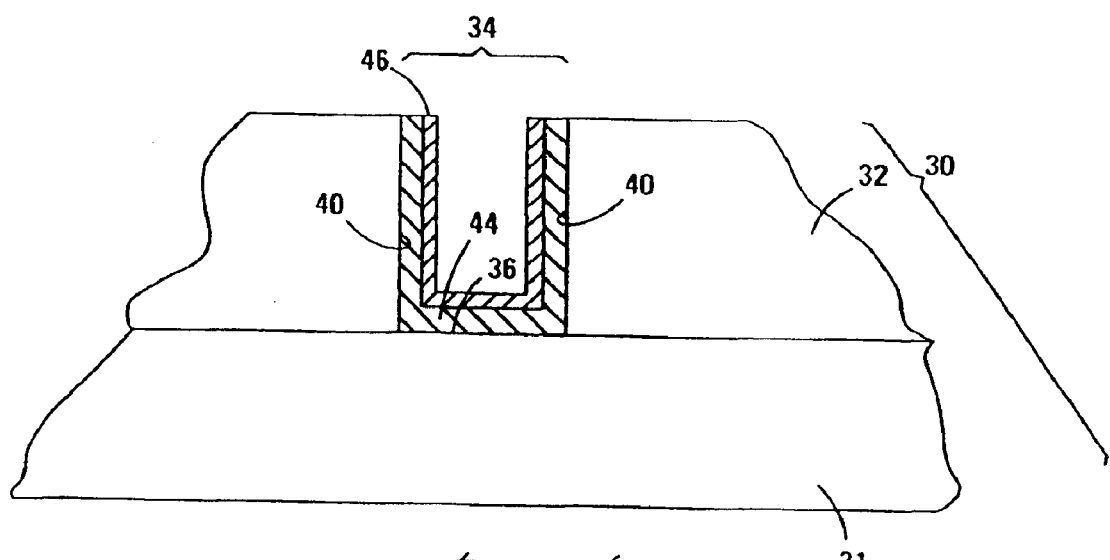
Figure 2E:
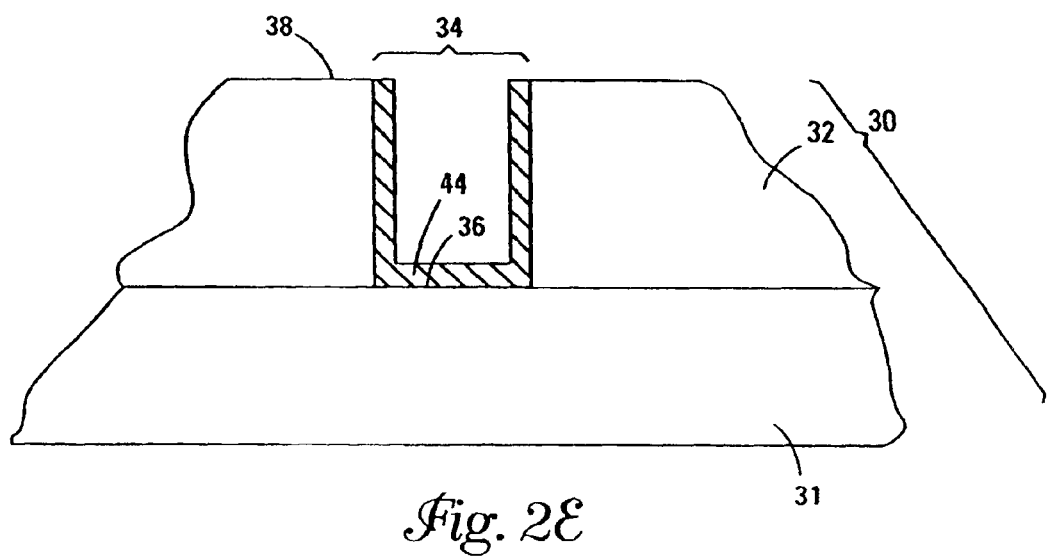

FIGS. 2A–2E illustrate a method of forming a conformal layer of conductive material 44, e.g., a layer of platinum or a layer of a platinum alloy such as platinum-rhodium, within an opening 34 defined in a substrate assembly 30 according to the present invention (see FIG. 2E). As shown in FIG. 2A, substrate assembly 30 includes a first portion 31 and a second portion 32, preferably of an insulative material. Second portion 32 is formed on first portion 31 and includes an opening 34 defined therein by a bottom surface 36 of the first portion 31 and one or more side walls 40 of the second portion 32. Preferably, bottom surface 31 is a generally horizontal surface from which one or more side walls 40 extend. The one or more side walls 40 may be substantially orthogonal to the horizontal bottom surface 36, as shown in FIG. 2A, or may be of any other desired angle or shape for forming a desired opening 34 in second portion 32. Second portion 32 further includes an upper surface 38, e.g., generally horizontal and parallel to bottom surface 36 in the particular illustrative embodiment as shown in FIG. 2A. The one or more side walls 40 and the generally horizontal upper surface 38 of second portion 32 share an edge or corner 33. For example, the upper surface 38 may be a planarized surface formed prior to the etching or definition of opening 34 in upper portion 32. One skilled in the art will recognize that the defined opening 34 may take one of any number of shapes and that the present invention is advantageous for forming a conformal material lining within any opening defined by one or more surfaces.

As used in this application, "substrate assembly" refers to either a semiconductor substrate such as the base semiconductor layer, e.g., the lowest layer of silicon material in a wafer, or a silicon layer deposited on another material such as silicon on sapphire, or a semiconductor substrate having one or more layers or structures formed thereon or regions formed therein. When reference is made to a substrate assembly in the following description, various process steps may have been previously used to form or define regions, junctions, various structures, or features and openings such as transistors, active areas, diffusions, implanted regions, vias, contact openings, high aspect ratio openings, etc.

For example, substrate assembly 30 may be a structure upon which a capacitor is formed with the second portion 32 of the substrate assembly 30 being an insulative layer such as an oxide layer, e.g., silicon dioxide, BPSG, PSG, etc. As such, opening 34 defined in substrate assembly 30 by one or more surfaces, e.g., bottom surface 36 and side walls 40, is defined by surfaces upon which a bottom electrode of a storage cell capacitor is formed such as described with reference to FIGS. 9A–9B, e.g., a container-type capacitor.

Further, for example, first portion 31 of substrate assembly 30 may include a source and/or drain region to which a contact is to be made through an insulative layer 32. As such, opening 34 defined by bottom surface 36 and one or more side walls 40 may be a contact opening to a region to be interconnected using one or more conductive materials deposited according to the present invention, such as described with reference to FIGS. 8A–8B herein.

Further, for example, the substrate assembly 30 may include any opening or structure in which a conductive layer is to be formed. For example, the structure may include a stepped feature such as an isolation trench or any other feature upon which a conformal layer or liner is desired. The methods according to the present invention may be used for any application requiring such conductive material formation, e.g., conformal layers of conductive materials, preferably one or more Group VIII metals such as platinum or alloys thereof. However, the present invention is particularly beneficial for providing conformal coverage on surfaces of features, e.g., bottom surface and one or more side wall surfaces, defining a small high aspect ratio opening such as contact holes or vias through an oxide insulating layer to underlying material, trenches, openings for formation of cell electrodes, etc. As such, one skilled in the art will recognize that the methods as described herein may be used to form any conductive material on any surface area within an opening, although preferably for forming conductive material including one or more Group VIII metals.

As described herein, small high aspect ratio openings have feature sizes or critical dimensions below about 1 micron (e.g., such as diameter or width of an opening being less than about 1 micron). Further, such small high aspect ratio openings have aspect ratios greater than about 1. Such critical dimensions and aspect ratios are applicable to contact holes, vias, trenches, and any other configured openings. For example, a trench having an opening width of 1 micron and a depth of 3 microns has an aspect ratio of 3.

As used herein, "planarization" refers generally to the mechanical removal of material at a wafer surface, e.g., the flattening and polishing process used during typical wafer fabrication processes. For example, such planarization may include chemical mechanical polishing, chemical mechanical planarization, planarization using pads and abrasive slurries, planarization using fixed abrasive pads, planarization using fixed abrasive pads in combination with slurries and/or other fluid compositions, or any other mechanical surface material removal method for providing a flattening of surfaces of a wafer during the wafer fabrication process. The present invention is not limited to any particular planarization equipment. Further, any number of planarization process steps may be used, e.g., repeated planarization for several periods of time, cleaning steps, etc.

As used herein, "dry etch" refers to any process using a plasma to remove material in wafer fabrication. Therefore, for example, dry etching as used herein includes not only the use of reactive gases energized by a plasma to remove material via volatilization of material, but also includes sputter etching or ion milling, e.g., argon energized by plasma to physically sputter and remove material from a surface. Further, as used herein, a "wet etch" refers to any etching or removal of material by way of a liquid composition, e.g., the removal of material by exposure to a liquid composition, such as by immersion. One skilled in the art will recognize that various dry etch and wet etch processes are known and that the present invention contemplates the use of various types of such processes in achieving the desired result as further described herein; such processes being particularly dependent on the materials being removed.

Although the present invention is described generally below with respect to the formation of any conductive material within an opening, the present invention is particularly advantageous to the formation of conductive material including one or more Group VIII metals. In other words, the processes described herein are applicable to the formation of material, wherein the material includes one or more Group VIII metals, e.g., metals or metal alloys. More preferably, the present invention is particularly applicable to the Group VIII metals including platinum, palladium, ruthenium, iridium, osmium, and rhodium, and further any metal alloys thereof, e.g., platinum-rhodium.

Further, with reference to FIGS. 2A–2E, one illustrative method of forming the conductive material in opening 34 defined in substrate assembly 30 shall be further described. As shown in FIG. 2B, conductive material 44, e.g., one or more conductive layers, is conformally formed over the surfaces defining opening 34 and upon upper surface 38 of upper portion 32, e.g., insulative layer 32. In other words, for example, conductive material including one or more Group VIII metals, e.g., a platinum layer or a platinum alloy layer such as platinum-rhodium, is formed over the bottom surface 36 and the one or more side walls 40 which define opening 34, and also upon upper surface 38 of portion 32. The conductive material 44 may be formed by any suitable process, such as sputtering or chemical vapor deposition (CVD). The method of forming or depositing the materials described herein is not considered to be a limitation on the scope of the present invention as any suitable technique for forming the conductive material, as well as any of the other layers described herein, may be used. Preferably, the conductive material 44 is formed to a sidewall thickness of about 50 Å to about 400 Å. Further, the conductive material 44 may be provided through the formation of more than one layer.

After the conductive material, e.g., one or more conductive layers 44 are formed, a support film 46 is formed thereover. The support film 46 is preferably an oxide material. More preferably, the support film 46 is formed of a material that can be removed, such as with a wet etch, at a faster rate than the materials for forming upper portion 32 of substrate assembly 30. For example, upper portion 32 may be formed of BPSG or a densified BPSG. Such materials may be etched at a rate of about 53 angstroms (Å) per minute in a QE-II etch composition (a wet clean solution available from Olin Hunt under the trade designation QE-II (40% by weight $NH_4F$, and 1.2%–1.3% by weight $H_3Po_4$)). Further, for example, a BOE (buffered oxide etch) composition, which is a dilute solution of HF buffered with $NH_4F$, may be used, e.g., a 20:1 BOE composition (20 parts of 454 g $NH_4F$ in 680 ml water and one part 48% HF) may be used to etch such materials at a rate of 250 Å per minute. Preferably, the support film 46 is formed of a material that etches at least 1.5 times that of the material forming upper portion 32 in which opening 34 is defined. For example, the support film 46 may be formed of low silane oxide (LSO) which etches at a rate of about 80 Å per minute in a QE-II etch composition and at a rate of about 690 Å per minute in a 20:1 BOE composition. As such, the etch rate ratio of the LSO to densified BPSG is selected to be greater than 1.5. Other materials, such as, for example, PSG, TEOS, ozone enhanced TEOS, spin on glass (SOG), silicon nitride (e.g., a PECVD deposited silicon nitride), and silicon oxynitride may also form suitable support films 46 which etch at a faster rate than the material generally used for upper portion 32 in which opening 34 is defined when subjected to a predetermined etch technique.

Any method of forming the support film 46 may be used. Further, the support film may include one or more materials or layers. However, preferably, the support film 46 is a single layer of an oxide material. The present invention is not limited to any particular method for forming the support film 46 or any of the other layers or materials described herein. Preferably, the support film 46 is formed to a sidewall thickness in the range of about 50 Å to about 500 Å.

After forming support film 46, a fill material 48 is provided within opening 34 over support film 46 to completely fill the opening 34. The fill material may also be formed outside of the opening 34 over support film 46 above upper surface 38. The fill material 48 is formed of any material easily removed and/or planarized. For example, the fill material may be an oxide material, a nitride material, a polysilicon material, or a photoresist material. Preferably, the fill material 48 is a photoresist material.

After the stack of materials, including the conductive material 44, the support film 46, and the fill material 48, are formed over substrate assembly 30 and completely fill the opening 34 defined in the substrate assembly 30, a planarization process is used to remove portions of the fill material 48, support film 46, and conductive material 44 outside of the opening 34. In other words, a planarization process is used to remove such materials to at least the upper surface 38 of upper portion 32 of substrate assembly 30. It will be recognized that a small amount of upper surface 38 material may also be removed.

Figure 1A:
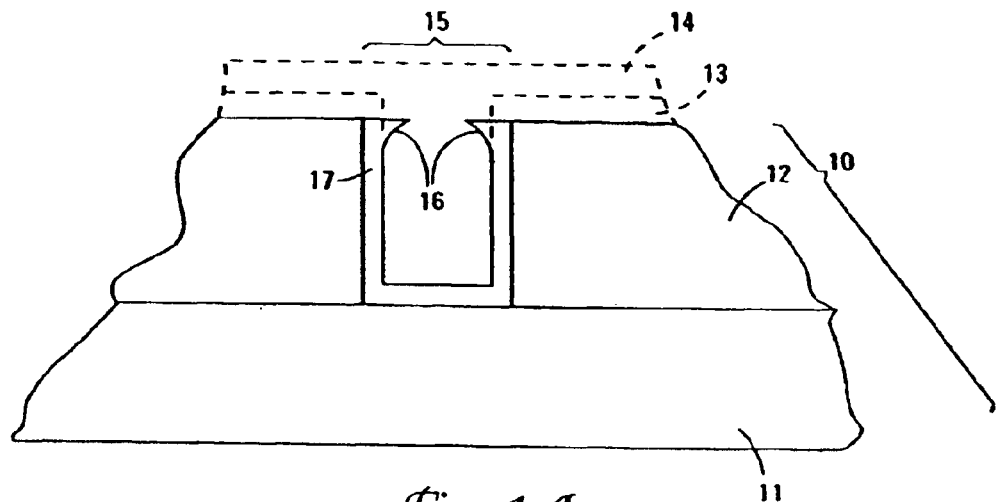
FIGS. 1A and 1B illustrate planarization problems associated with the formation of Group VIII metals as bottom electrodes in a container-type cell capacitor structure.
Figure 3:
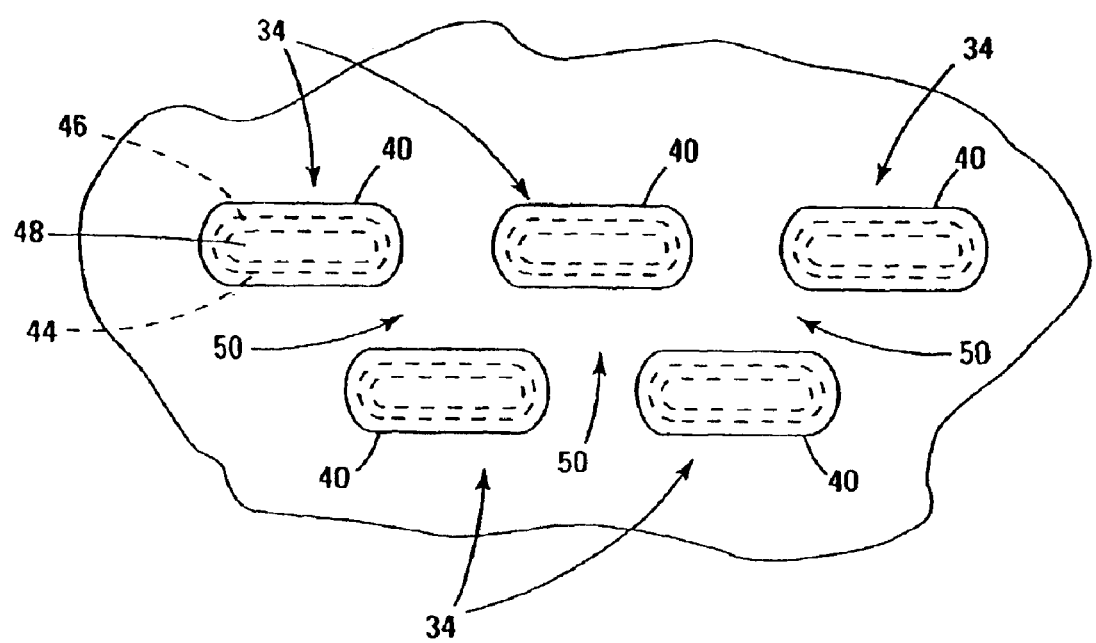
FIG. 3 illustrates a top plan view of multiple openings at one particular point in the process as described with reference to FIGS. 2A–2E.

The support film 46, and also the fill material 48, to some degree, provides support to the underlying conductive material 44 such that during planarization the conductive material 44 is prevented from being pushed into the center of the opening 34. This is unlike the prior art, as shown in FIG. 1A. A top plan view of multiple openings 34 are shown in FIG. 3. The multiple openings 34 are filled with the stack of materials including the conductive material 44, the support film 46, and the fill material 48. Along with preventing the conductive material, such as platinum, from smearing into the opening 34, the structure provided during the planarization process also provides opening to opening support during the planarization process. In other words, such a structure provides support in the regions 50 between the containers to assist in providing a suitable planarization process down to the upper surface 38 of the upper portion 32 of substrate assembly 30. For example, when forming container-type electrode structures, such a stack of materials, and in particular the support film 46, provides for container to container support for the planarization process to achieve desirable planarization down to the surface 38.

After the planarization process is performed, the resultant structure is shown in FIG. 2C. The resultant structure includes the conductive material 44 lining the opening 34 defined by the bottom surface 36 and the one or more side walls 40, the support film 46 conformally formed thereover within the opening 34, and the fill material 48 which still completely fills the opening 34.

Thereafter, the fill material 48 within the opening 34 is removed as shown in FIG. 2D. Any method of removing the fill material 48 may be used according to the present invention. Preferably, a wet etch and/or a dry etch process is used to remove the fill material 48. For example, if the fill material 48 is a photoresist, the photoresist may be removed by an oxygen ash, or any other suitable technique such as a concentrated developer composition or a wet ozone strip. Preferably, the fill material 48 is formed of a material that is removed at a faster rate than the material at the surface 38 of the upper portion 32 when subjected to a wet etch or dry etch to remove the fill material 48 from within the opening 34.

After the fill material 48 has been removed, the support film 46 is then removed resulting in the structure as shown in FIG. 2E, e.g., one or more conductive layers 44 conformally formed on the surfaces defining opening 34 in upper portion 32 of substrate assembly 30. The support film 46 may be removed by any method that is selective with respect to the material forming upper portion 32, e.g., a dry etch or a wet etch. Although some removal of the material forming upper portion 32 may be permitted depending on the desired structure to be achieved, preferably, the removal technique removes the support film 46 at a rate which exceeds removal of the material forming upper portion 32. More preferably, the support film is removed at least 1.5 times as fast as the material forming the upper portion 32. Preferably, a minimal loss of material of upper portion 32 is achieved with adequate removal of the support film 46. For example, LSO may be removed using a QE-II etch composition or a 20:1 BOE etch composition. Likewise, if the support film 46 is a PSG film, such a film may also be suitably removed using a 20:1 BOE composition.

Figure 1B:
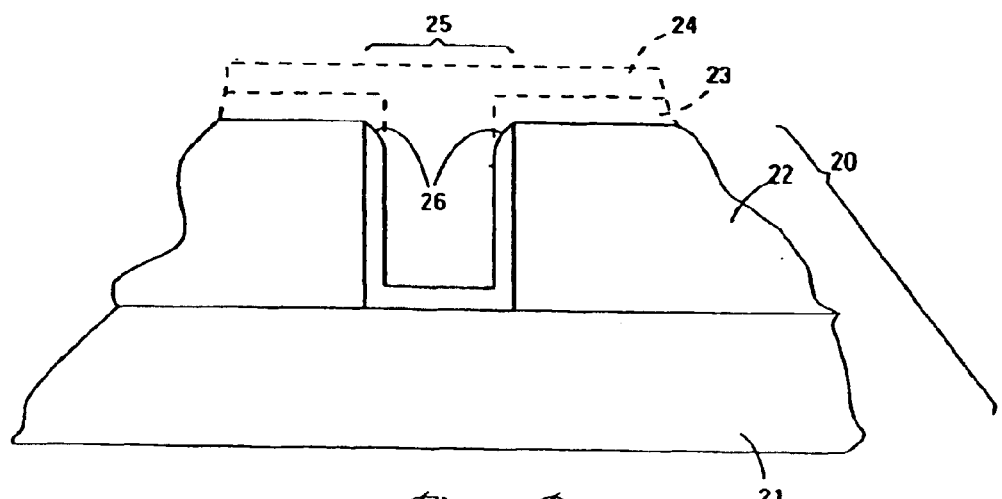

As shown in FIG. 2E, the resultant conductive material 44 is self-aligned inside the opening 34 using the planarization process described above even though the conductive material used includes one or more Group VIII metals which are difficult to planarize. In this method of forming such a conformal lining in opening 34 using one or more Group VIII metals, the problems as previously described herein with reference to FIGS. 1A and 1B are substantially eliminated.

It will be recognized that the conductive material 44 may include barrier or adhesion-type layers formed underlying other materials such as platinum or a platinum alloy. As such, although the present invention is described as being particularly advantageous for conductive layers formed of Group VIII metals, the present invention is advantageous when any one of one or more conductive layers to be conformally formed within the opening 34 is formed of a Group VIII metal. For example, titanium nitride, tungsten nitride, tantalum nitride, tantalum silicon nitride, or titanium silicon nitride may be formed as diffusion barrier or adhesion layers.

Figure 4A:
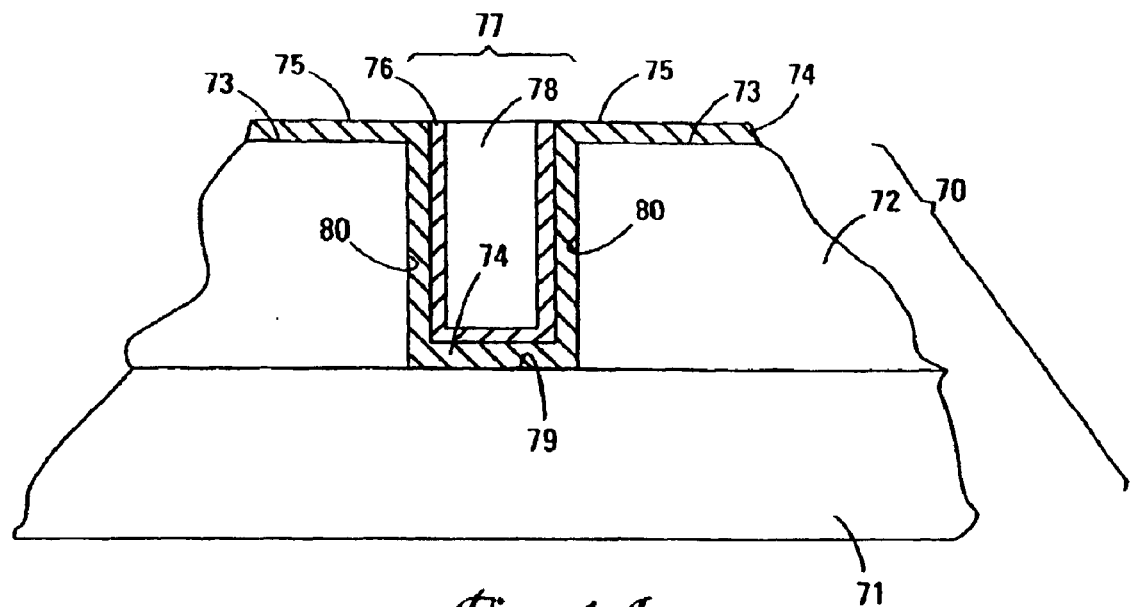
FIGS. 4A–4B illustrate an alternate embodiment of a method of forming a conductive material, e.g., platinum, in an opening according to the present invention.
Figure 4B:
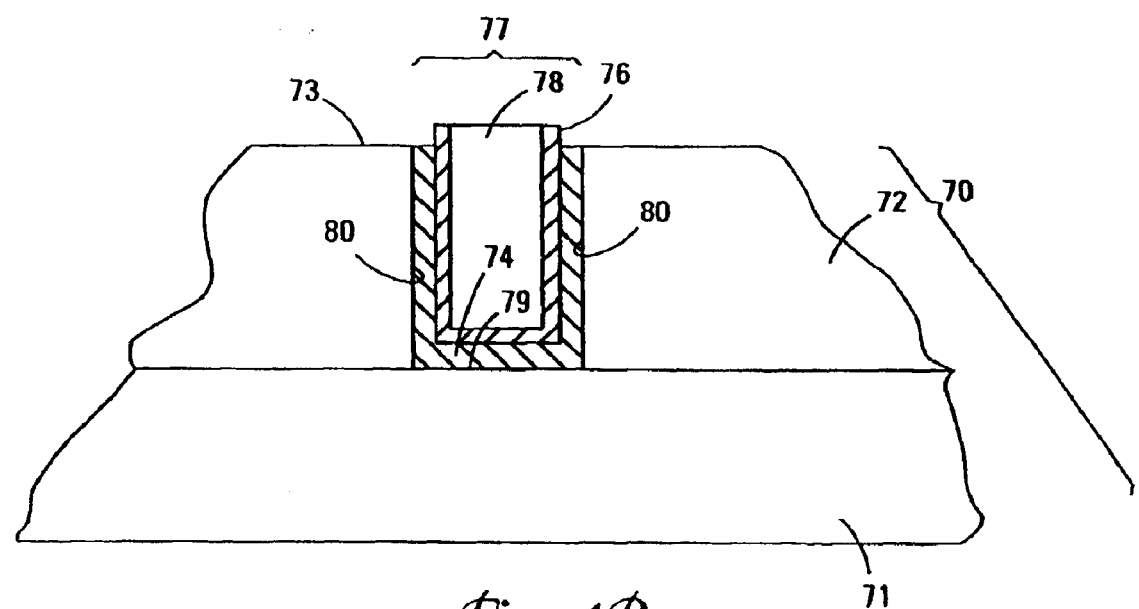

FIGS. 4A–4B show an alternate illustrative embodiment of a method for lining an opening with conductive material.

As shown in FIG. 4A, a substrate assembly 70 includes a first portion 71 and a second portion 72 formed thereover. An opening 77 is defined in the upper portion 72 by bottom surface 79 and one or more side walls 80. In this method of forming the conductive material on the surfaces defining opening 77, planarization is stopped on an upper surface 75 of the conductive material 74 as opposed to planarizing the stack of materials to an upper surface 73 of the upper portion 72.

In this illustrative method, a stack of materials substantially the same as shown in FIG. 2B are provided. For example, the stack includes the conductive material 74, the support film 76, and a fill material 78. As it may be difficult to planarize certain Group VIII metals, such as platinum, this particular alternate embodiment uses the Group VIII metal as a planarization stop or end point. In other words, the stack is planarized down to the upper surface 75 of the conductive material 74. FIG. 4A shows the resultant structure upon completion of such a planarization process stopping on the upper surface 75 of the conductive material 74. As such, the resultant structure includes the conductive material over the upper surface 73 of the second portion 72 of substrate assembly 70 and also conformally lining the opening 77 defined by bottom surface 79 and one or more side walls 80. Further, the resultant structure following planarization includes the support film 76 formed over the conductive material 74 within the opening 77 and the fill material 78 within the opening 77.

After planarization, the conductive material 74, e.g., platinum or an alloy thereof, outside of the opening 77 is removed. In other words, the conductive material 74 formed on the upper surface 73 of second portion 72 of substrate assembly 70 is removed.

The removal of the conductive material 74 outside of the opening 77 may be performed by a wet etch and/or a dry etch. For example, platinum may be removed using an aqua regia solution, generally a 3:1 hydrochloric acid:nitric acid solution. In such a case, the platinum within the opening 77 is protected by the support film 76, e.g., PSG, LSO, etc. Further, for example, such a platinum material may be removed by a suitable dry etch process such as, for example, an argon and $Cl_2$ plasma or an argon plasma energized to sputter remove the platinum.

Following the removal of the conductive material 74 outside of the opening 77, the resultant structure is shown in FIG. 4B. The resultant structure shown in FIG. 4B is similar to that shown in FIG. 2C and the fill material 78 and support film 76 may be removed in a similar manner to that described with reference to FIGS. 2A–2E. As such, a self-aligned conductive material is formed in opening 77 similar to that shown in FIG. 2E.

Figure 5A:
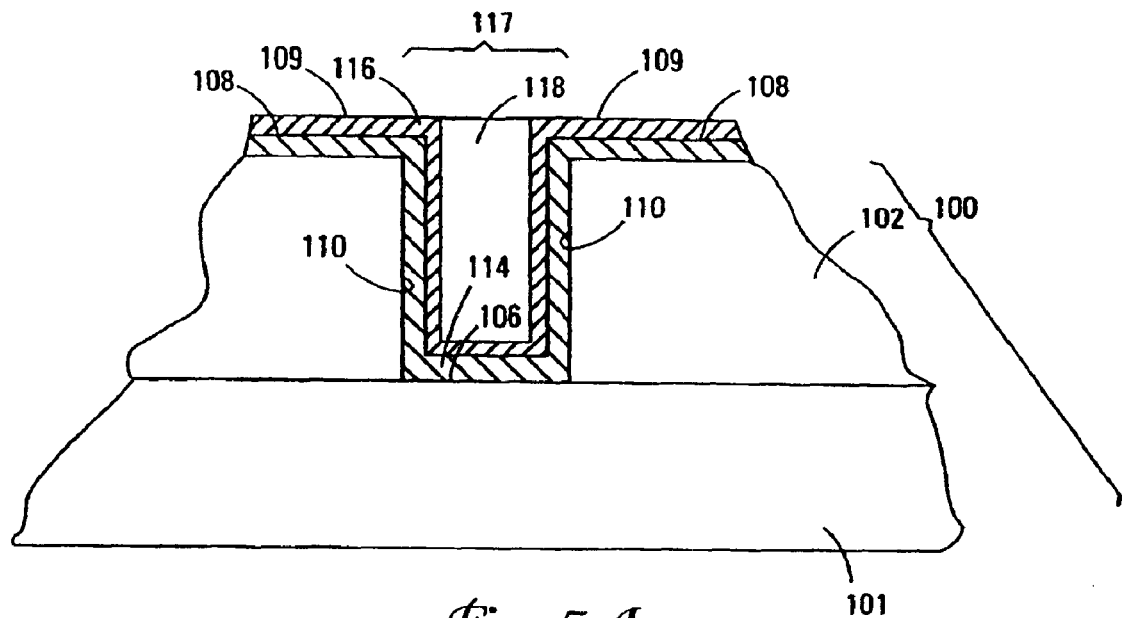
FIGS. 5A–5C illustrate yet another alternate method of forming a conductive material within an opening according to the present invention.
Figure 5B:
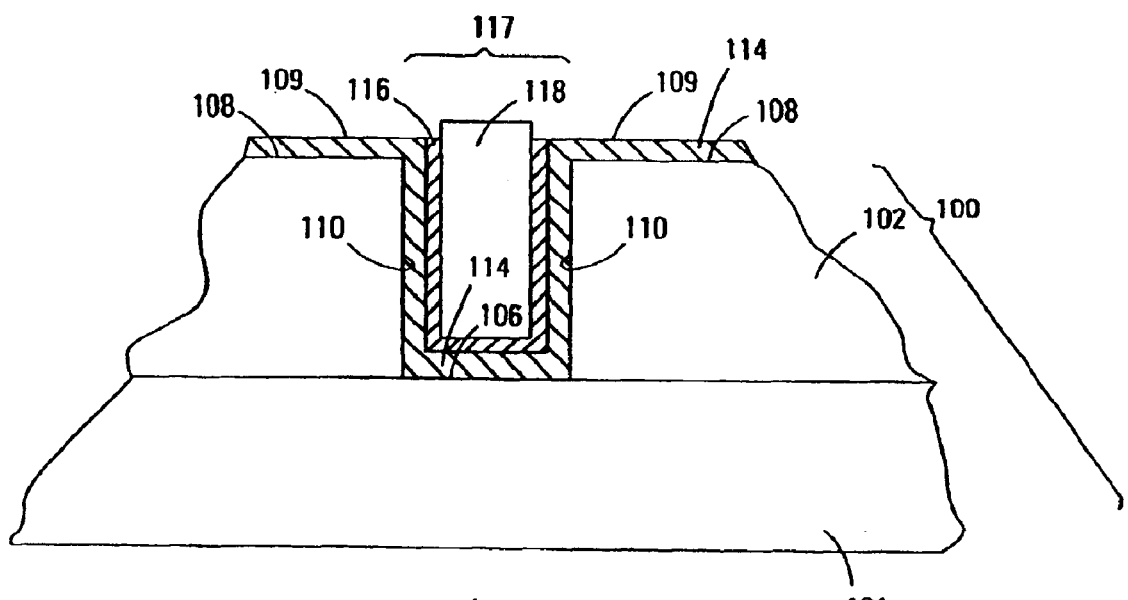
Figure 5C:
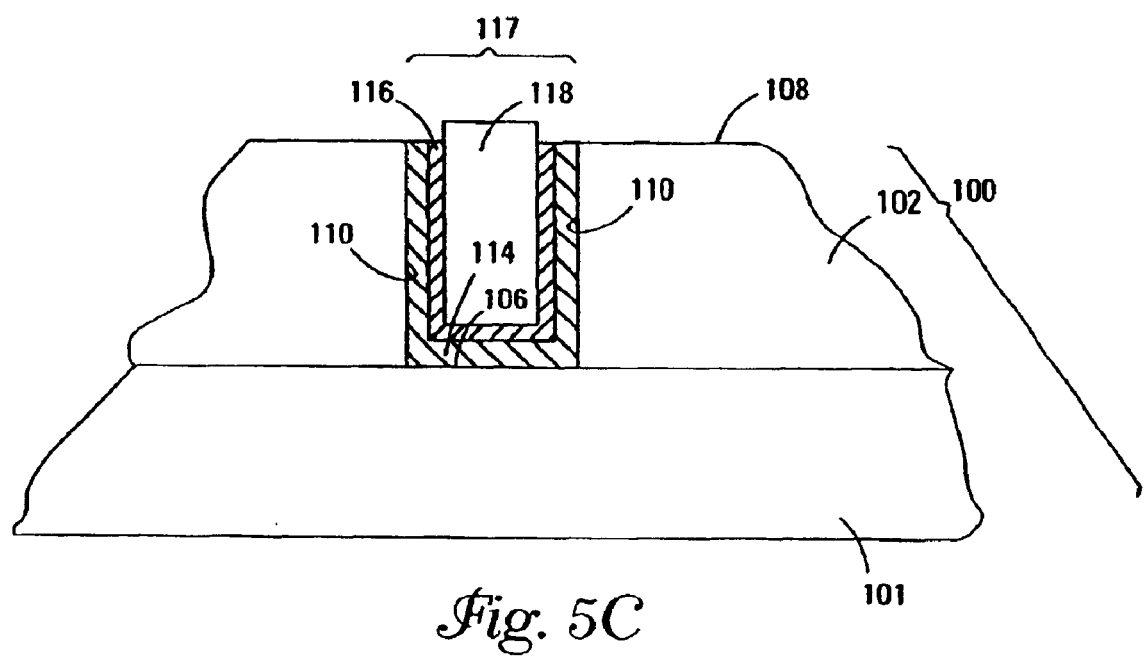

Another illustrative alternate embodiment of a method for forming the conductive material in an opening is shown in FIGS. 5A–5C. FIG. 5A shows the resulting structure following planarization according to the present invention. Prior to such planarization, an initial structure is substantially similar to that shown in FIG. 2B. The initial structure includes an opening 117 defined in a second portion 102 of a substrate assembly 100. The substrate assembly 100 includes a first portion 101 and a second portion 102 formed thereover. As previously described, the second portion 102 is preferably an insulative material in which the opening 117 is defined by one or more surfaces including bottom surface 106 and one or more side walls 110. A stack of materials is then formed. The stack includes conductive material 114 which is formed within opening 117 on the surfaces defining the opening 117 including bottom surface 106 and the one or more side walls 110, and which is also formed on upper surface 108 of second portion 102. The stack of materials further includes a support film 116 formed over the conductive material 114 and a fill material 118 formed thereover in a manner substantially like that shown in FIG. 2B. However, as shown in FIG. 5A, the planarization process is stopped on the upper surface 109 of the support film 116. This is in contrast to stopping the planarization process on the conductive material 74 as shown in and described with reference to FIGS. 4A–4B and in contrast to the planarization process stopping on the upper surface 38 of second portion 32 as shown and described with reference to FIGS. 2A–2E.

With the planarization process stopping or having its end point on the upper surface 109 of the support film 116, a wet etch and/or dry etch is used to remove the portion of the support film 116 outside of the opening 117. For example, if the support film is formed of an oxide material such as PSG, a BOE wet etch may be used to remove the support film 116 which exists outside of the opening 117. Further, for example, a dry etch such as a $C_2F_6$, $CHF_3$, or a $CF_4$ etch may be used to remove an oxide support film.

The resultant structure following such a wet etch and/or dry etch of the support film 116 outside of the opening 117 is shown in FIG. 5B. With the support film 116 removed outside of opening 117, a wet etch and/or dry etch may be used to remove the conductive material 114 outside of the opening 117. In other words, for example, if the conductive material is platinum, a wet etch such as an aqua regia etch may be used to remove the platinum down to the upper surface 108 of the second portion 102 of substrate assembly 100. Further, for example, a dry etch using an argon plasma may be used to sputter remove the platinum.

With the conductive material 114, e.g., platinum or platinum alloy, removed outside of opening 117, the resultant structure is shown in FIG. 5C. This structure is similar to that shown in FIG. 2C and upon removal of fill material 118 and support material 116 in a manner similar to that described with reference to FIGS. 2A–2E, a resultant structure having a conductive liner formed within the opening 117 similar to that as shown in FIG. 2E is accomplished.

In yet another alternate illustrative embodiment of the method for forming conductive material within an opening, a method similar to that described with reference to FIGS. 4A–4B is shown and described with reference to FIGS. 6A–6D below. The primary difference between such embodiments is that in FIGS. 6A–6D, a fill material is not used but rather only a support material 146 is used to accomplish the support and protection necessary to provide a self-aligned conductive material within the opening 145.

Figure 6A:
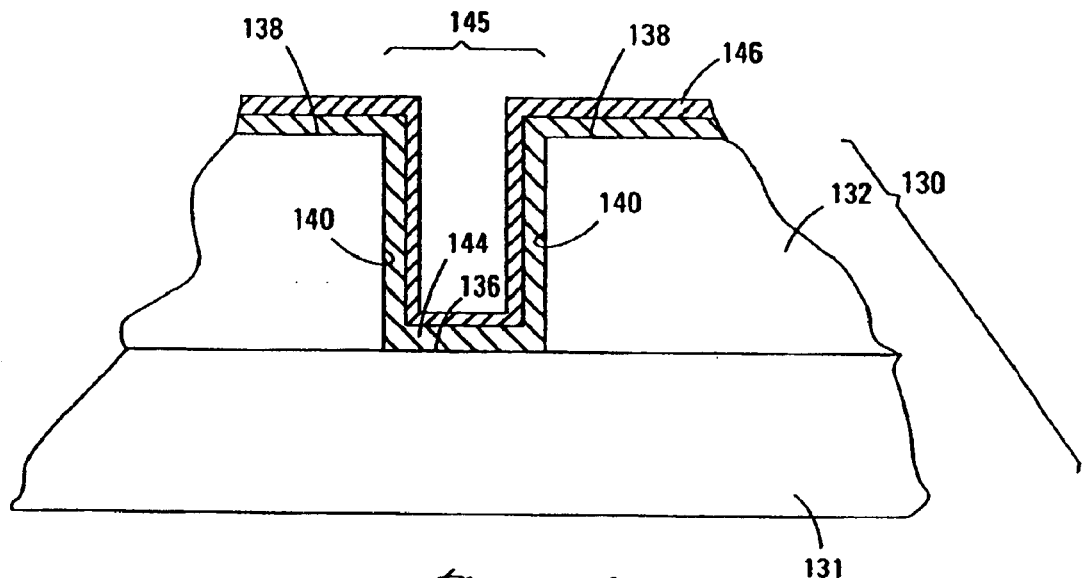
FIGS. 6A–6D illustrate yet further another alternate method of forming a conductive material within an opening according to the present invention.

As shown in FIG. 6A, a substrate assembly 130 includes a first portion 131 and a second portion 132, e.g., an insulative portion. The second portion 132 has an opening 145 defined therein. The opening 145 is defined by one or more surfaces including bottom surface 136 and one or more side walls 140. A stack of materials, e.g., layers, is formed over the substrate assembly 130 having the opening 145 defined therein. The stack of layers includes one or more conductive layers 144 formed on the bottom surface 136 and one or more side walls 140 defining opening 145, and further formed on upper surface 138 of second portion 132 of substrate assembly 130. A support film 146, such as described with reference to FIGS. 2A–2E, is formed over the one or more conductive layers 144.

Figure 6B:
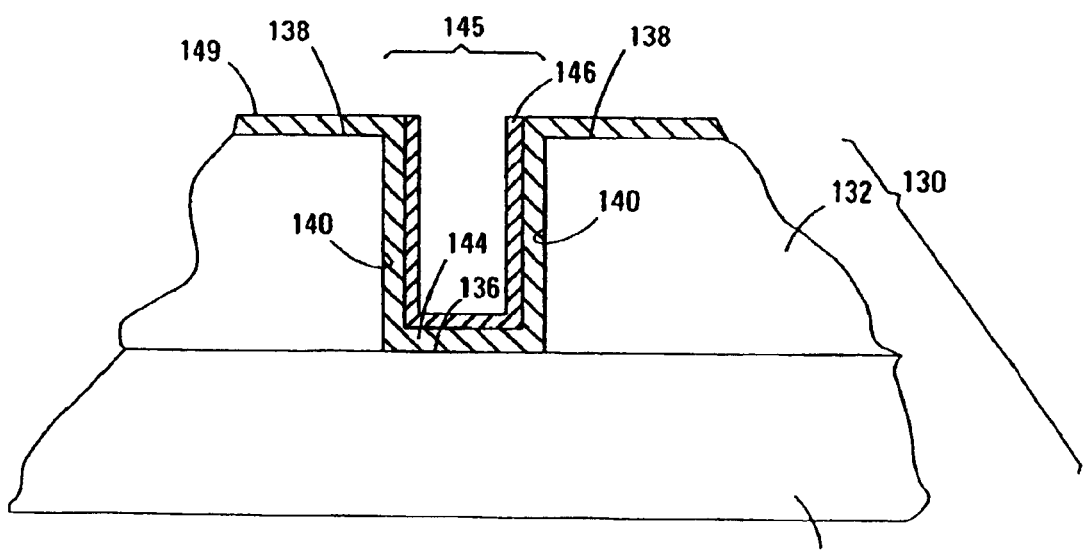

Upon formation of the stack of layers on substrate assembly 130, as shown in FIG. 6A, a planarization process is used to remove the support film 146 outside of the opening 145. In other words, the support film 146 is removed to the upper surface 149 of the one or more conductive layers 144 outside of the opening 145. The resultant structure of such a planarization process is shown in FIG. 6B.

Figure 6C:
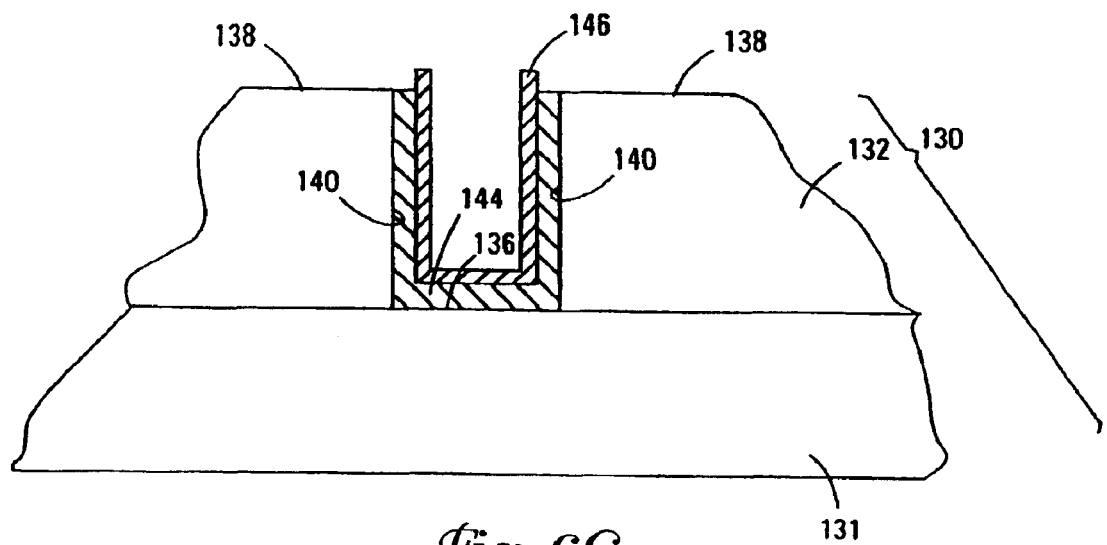

Thereafter, a wet etch and/or dry etch is used to remove the portions of the one or more conductive layers 144 outside of the opening 144 resulting in the structure shown in FIG. 6C. For example, as previously described herein, a platinum layer may be removed with a wet etch composition such as an aqua regia process. Thereafter, the support film 146 as shown in FIG. 6C may be removed in a manner similar to that described with reference to FIGS. 2A–2E resulting in the structure shown in FIG. 6D.

It will be recognized that the planarization process may also use the upper surface 138 as the end point in a manner such as that described with reference to FIGS. 2A–2E. However, unlike FIGS. 2A–2E, no fill material is formed or removed and support for planarization is provided by support film 146 alone.

Figure 6D:
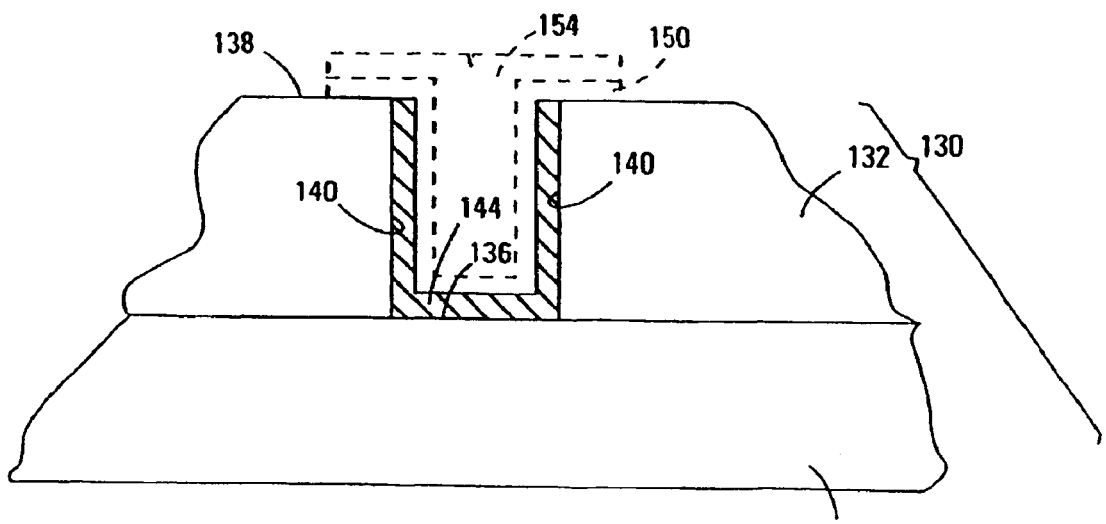

As further shown in FIG. 6D, the one or more conductive layers 144 may be used as a lower electrode of a container-type cell capacitor. Thereafter, a dielectric material 150 is formed relative to at least a portion of the lower electrode and a second electrode 154 is formed on at least a portion of the dielectric material 150. Such an application for a capacitor structure will be further described with reference to FIGS. 9A–9B.

A final alternate illustrative embodiment of a method of forming conductive material within an opening is shown in FIGS. 7A–7D. In this particular illustrative embodiment, a single type of material is formed which entirely fills the opening 175 defined in substrate assembly 170 as opposed to the embodiment of FIGS. 6A–6D in which only a support film 146 is formed without entirely filling the opening 145.

Figure 7A:
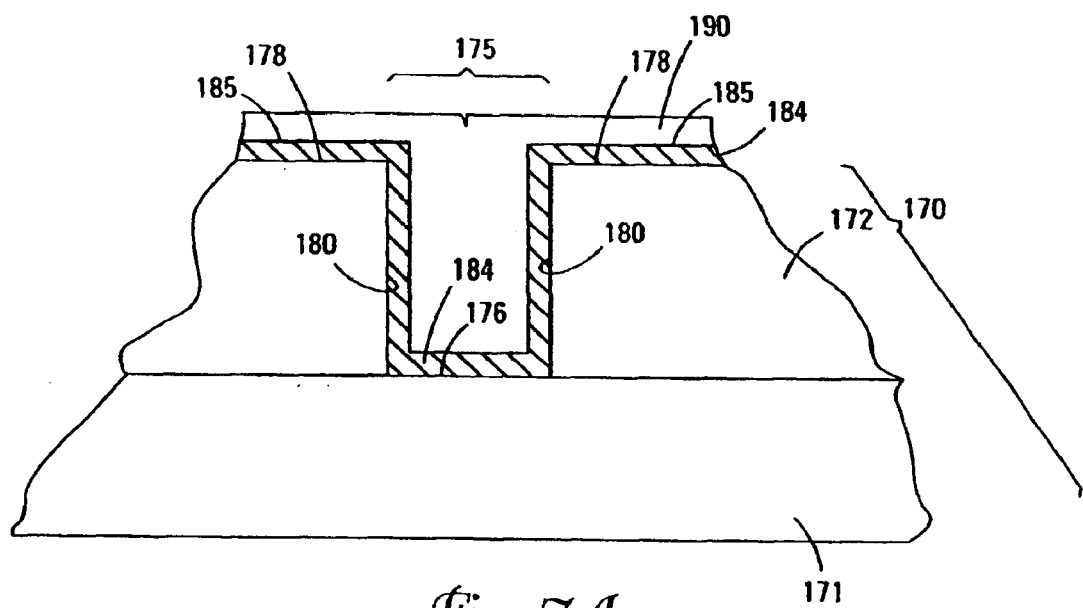
FIGS. 7A–7D yet further illustrate another alternate illustrative embodiment for forming a conductive material within an opening according to the present invention.

The substrate assembly 170 shown in FIG. 7A includes a first portion 171 and a second portion 172, e.g., an insulative portion. The second portion 172 includes an opening 175 defined in second portion 172 by one or more surfaces including, for example, bottom surface 176 and one or more side walls 180. Conductive material 184, such as that described with reference to FIGS. 2A–2E, is formed on the one or more surfaces defining opening 175 and on upper surface 178 of second portion 172. Thereafter, a support material 190 is formed over the one or more conductive layers 184 and entirely fills the opening 175. Preferably, the support material 190 is also formed over the upper surface 185 of the conductive material 184.

In this particular embodiment, the support material 190 may be one or more of an oxide material, a nitride material (e.g., silicon nitride), a polysilicon material, a spin on glass (SOG), or a photoresist material. Preferably, the material is a photoresist to provide adequate support and protection as further described below.

Figure 7B:
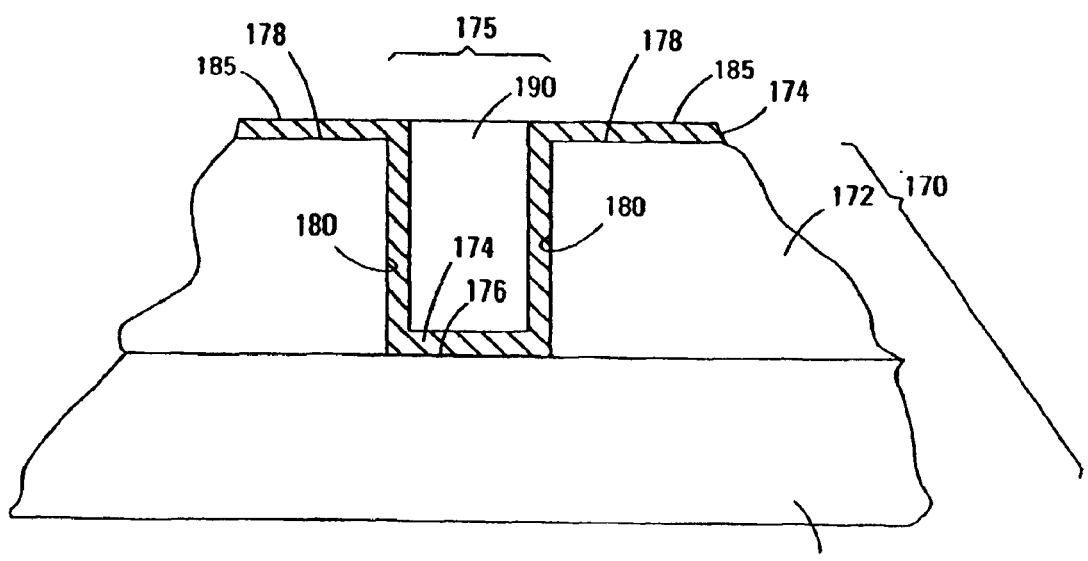

After formation of the support material 190, a planarization process is used to remove portions of the support material outside the opening 175 to the conductive material 184. In other words, for example, if the conductive material is a platinum layer or a platinum alloy layer, the planarization process is stopped on the upper surface 185 of the platinum or platinum alloy layer. As such, the advantageous characteristics of the platinum layer as an end point for a planarization process wherein other materials, such as an oxide, is removed is used for the benefit of the present formation method. The resultant structure after performance of the planarization process is shown in FIG. 7B. This resultant structure includes the conductive material 184 still existing over upper surface 178 of the second portion 172 and lining the opening 175. The support material 190 is now only within the opening 175.

Figure 7C:
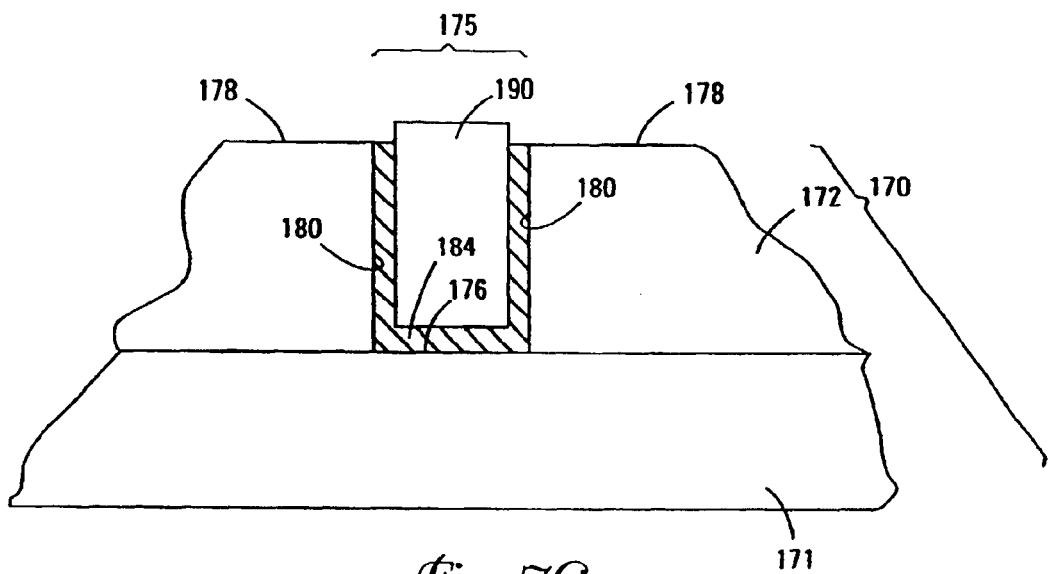

Thereafter, the conductive material 184 is removed outside of the opening 175 as shown in FIG. 7C. The removal of such conductive material outside of the opening 175 may be performed using a dry etch and/or a wet etch. For example, as previously described herein, platinum may be removed using the aqua regia composition removal technique. Further, a dry etch such as an argon plasma sputtering method may be used.

Figure 7D:
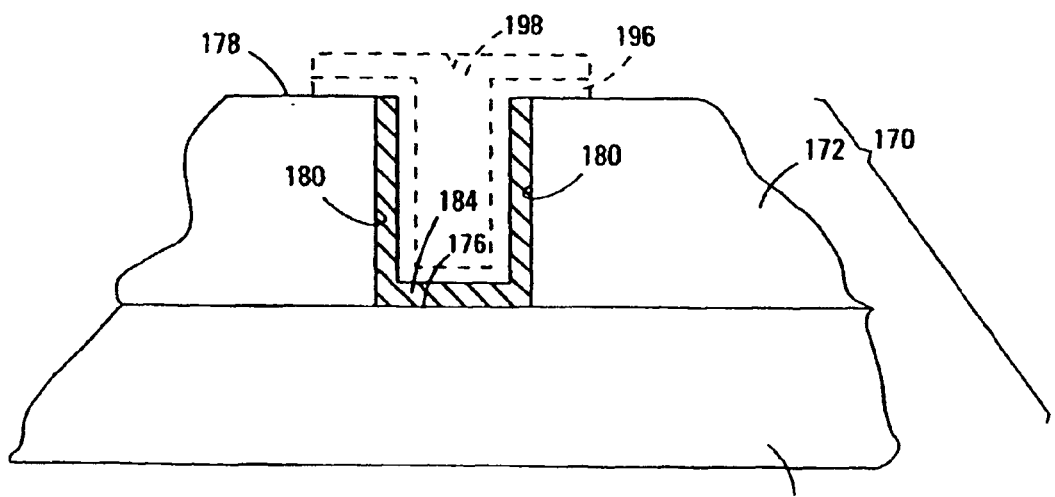

Thereafter, the support material 190 within the opening 175 is removed using a wet etch and/or a dry etch in a manner as described previously with reference to FIGS. 2A–2E. In other words, the same type of removal techniques for removing support film 46 or a fill material 48 may be used to remove support material 190. The resultant structure with the support material 190 removed is shown in FIG. 7D. Further, as shown in FIG. 7D, a capacitor structure using the conductive material 184 lining the opening 198 as the lower electrode thereof is shown. For example, the capacitor structure includes the lower electrode 184, a dielectric material 196 formed on at least a portion thereof, and a second electrode 198 formed on at least a portion of the dielectric material 196.

Two illustrations of using the above described methods of forming conductive material in an opening are described below with reference to FIGS. 8A–8B and FIGS. 9A–9B. The use of the formation methods according to the present invention is described with reference to FIGS. 8A–8B, wherein a contact liner is described. Further, the methods according to the present invention are described with reference to FIGS. 9A–9B, wherein conductive material is used for the bottom electrode of a high dielectric capacitor of a storage cell. For simplicity purposes, the descriptions are limited to the use of a platinum layer described in these two illustrative structures. There are other semiconductor processes and structures for various devices, e.g., CMOS devices, memory devices, etc., that will benefit from the present invention and in no manner is the present invention limited to the illustrative embodiments described herein, e.g., contact liner and electrode structure. The formation methods may be used for providing any self-aligning structure within an opening.

Figure 8A:
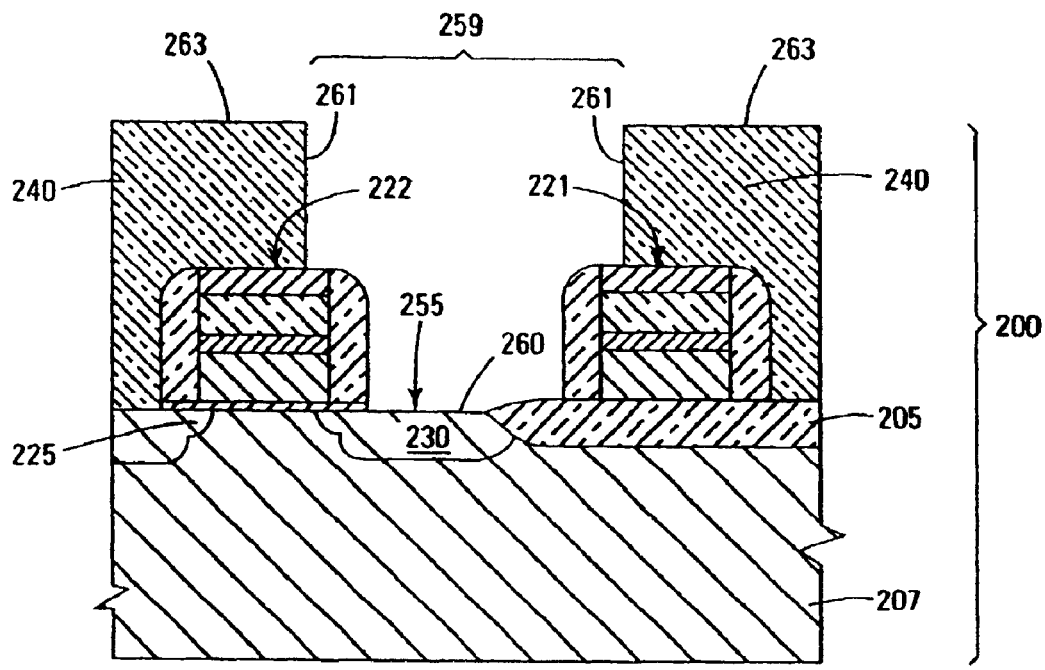
FIGS. 8A–8B show use of the methods described according to the present invention in a contact application.
Figure 8B:
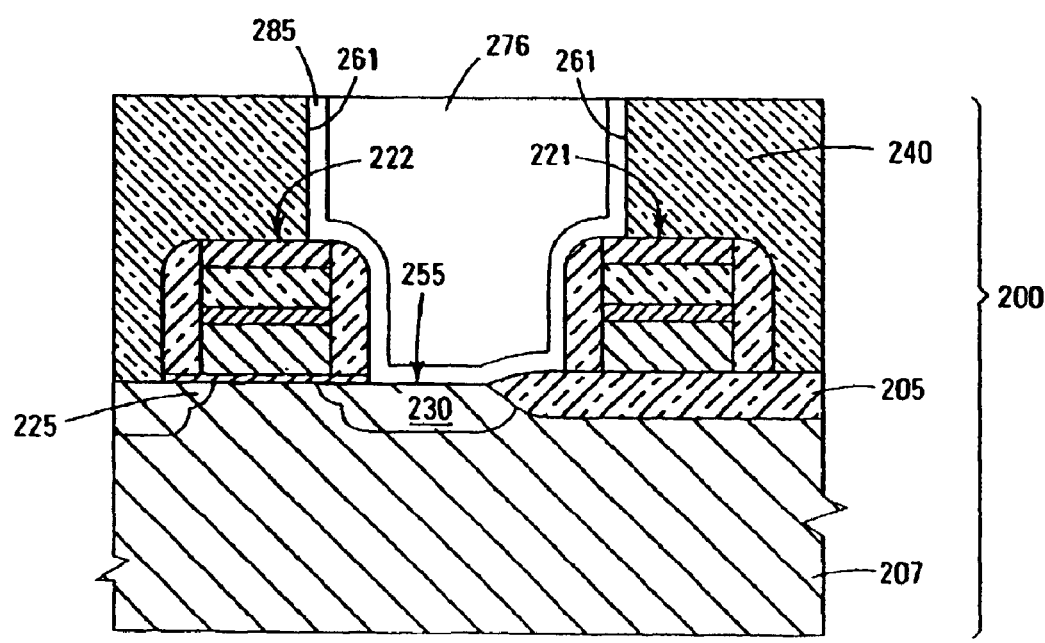

As shown in FIG. 8A, device structure 200 is fabricated in accordance with conventional processing techniques through the formation of a contact opening 259 prior to metallization of the exposed contact area 255 of substrate 207. As such, prior to metallization, the device structure 200 includes field oxide regions 205 and active areas, i.e., those regions of the substrate 207 not covered by field oxide. Formed relative to the field oxide regions 205 and the active areas are word line 221 and field effect transistor 222. Suitably doped source/drain regions 225 and 230 are formed as known to one skilled in the art. A conformal layer of oxide material 240 is formed thereover and contact opening 259 is defined therein to the exposed contact area 255 in doped region 230 of silicon substrate 207. Thereafter, one or more metallization or conductive layers are formed in the contact opening 259 for providing electrical connection to substrate region 230. For example, various materials may be formed in contact opening 259 such as adhesion-type layers, diffusion barrier materials, or other layers formed of one or more Group VIII metals. For example, the contact liner 285 may be formed of platinum deposited in accordance with the present invention upon bottom surface 260 and generally horizontal upper surfaces 263 along with the one or more side walls 261 defining the opening 259. The contact liner may be formed by any of the methods as previously described herein including planarization to remove one or more materials outside of opening 259. After formation of the contact liner 285 according to one or more of the illustrative methods described herein, a conductive material 276 is formed in the contact opening for providing connection to doped region 230 of substrate 207 as shown in FIG. 8B.

Figure 9A:
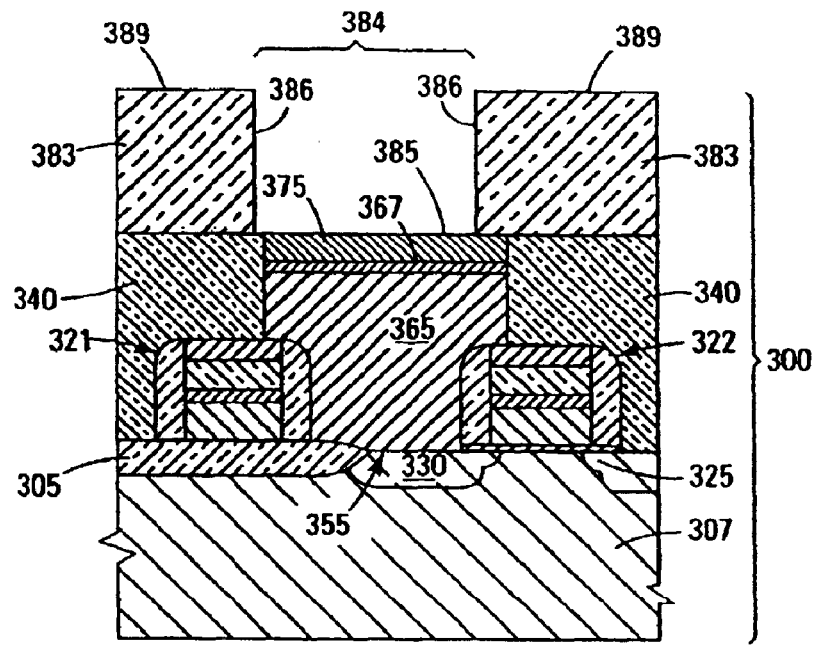
FIGS. 9A–9B illustrate the use of methods described according to the present invention in a container-type storage cell capacitor application.
Figure 9B:
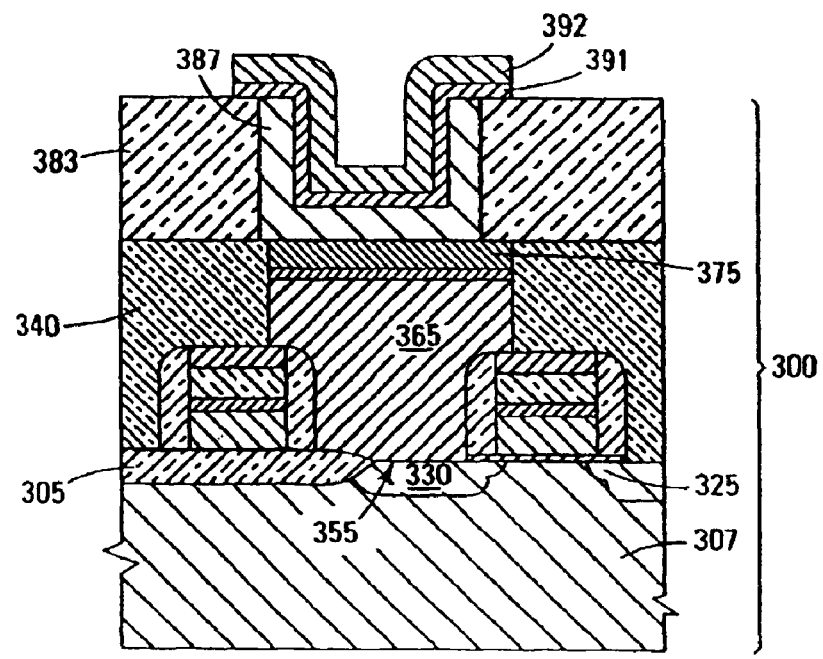

As shown in FIG. 9A, a device structure 300 is fabricated in accordance with conventional processing techniques through the formation of an opening 384. Such processing is performed prior to depositing a bottom electrode structure on the surfaces defining the opening 384 using one of the methods described in accordance with the present invention. As such, and as further described in U.S. Pat. No. 5,392,189 to Fazan, et al., the device structure 300 includes field oxide regions 305, and active regions, i.e., those regions of substrate 307 not covered by field oxide. A word line 321, and a field effect transistor (FET) 322 are formed relative to the field oxide region 305 and the active regions. Suitably doped source and/or drain regions 325, 330 are created in silicon substrate 307. An insulative conformal layer of oxide material 340 is formed over regions of FET 322 and word line 321. A polysilicon plug 365 is formed to provide electrical communication between the substrate 307 and a storage cell capacitor to be formed thereover. Various barrier layers are formed over the polysilicon plug 365, including layers 367 and 375 as shown in this illustrative embodiment. For example, one or more layers including those formed of titanium nitride, tungsten nitride, titanium silicide, or any other metal nitride or metal silicide layer may act as a barrier. Thereafter, another insulative layer 383 is formed and an opening 384 is defined therein. According to one embodiment of the present invention, a platinum layer 387 is formed on bottom surface 385 and one or more side walls 386 defining opening 384 according to any of the methods as described previously herein. As shown in FIG. 9B, a conformal self-aligned bottom electrode formed of the platinum conductive layer 387 lines the opening 384.

A dielectric material 391 is then formed relative to the platinum bottom electrode 187. For example, the dielectric layer may be any suitable material having a suitable dielectric constant such as $Ba_xSr_{(1-x)}TiO_3[BST]$, $BaTiO_3$, $SrTiO_3$, $PbTiO_3$, $Pb(Zr,Ti)O_3[PZT]$, $(Pb,La)(Zr,Ti)O_3[PLZT]$, $(Pb,La)TiO_3[PLT]$, $KNO_3$, $Ta_2O_5$, $Al_2O_3$ and $LiNbO_3$.

Further thereafter, a second electrode 392 is formed relative to the dielectric material 391. In one embodiment of the present invention, the second electrode 392 may also be formed of platinum. It will be recognized by one skilled in the art that either one or both of the electrodes of a capacitor may be formed of any conductive material generally used for capacitor electrode structures. For example, and preferably, the bottom electrode is formed of at least one Group VIII metal or an alloy thereof such as, for example, platinum, iridium, osmium, rhodium, or ruthenium. Further, it will be recognized that the layer including one or more Group VIII metals may be one of several layers forming an electrode stack. For example, as previously mentioned, a barrier layer or an adhesion layer may be used with one or more layers containing a Group VIII metal.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the formation methods as described herein to provide a conductive material within an opening. Various modifications of the illustrative embodiments, as well as additional embodiments of the invention, will be apparent to persons skilled in the art upon reference to this description. It is therefore contemplated that the appended claims will cover any such modifications or embodiments that may fall within the scope of the present invention as defined by the accompanying claims.

What is claimed is:

1. A method of providing a conductive material in an opening, the method comprising:

providing a substrate assembly having at least one surface;

providing an opening defined through the surface of the substrate assembly, wherein the opening is defined by at least one surface;

forming at least one conductive material within the opening on the at least one surface defining the opening and on at least a portion of the substrate assembly surface;

forming at least support material over the at least one conductive material, wherein forming at least support material comprises forming a support film over the at least one conductive material, wherein the opening is not completely filled by the support film;

removing at least the support material outside of the opening to the at least one conductive material by planarization, wherein removing at least the support material outside the opening by planarization to the at least one conductive material comprises planarizing the support film outside the opening to the at least one conductive material;

removing the at least one conductive material outside the opening, wherein removing the at least one conductive material outside the opening comprises removing the at least one conductive material outside the opening to at least the substrate assembly surface using at least one of a wet etch and dry etch; and removing the support material within the opening.

2. The method of claim 1, wherein the at least one conductive material comprises at least one Group VIII metal.

3. The method of claim 1, wherein removing the support film within the opening comprises removing the support film using at least one of a wet etch and a dry etch.

4. The method of claim 3, wherein the support film comprises at least one material selected from the group consisting of silicon nitride, silicon oxynitride, an oxide material, and spin on glass.

5. A method of providing a conductive material in an opening, the method comprising:

providing a substrate assembly having at least one surface;

providing an opening defined through the surface of the substrate assembly, wherein the opening is defined by at least one surface;

forming at least one conductive material within the opening on the at least one surface defining the opening and on at least a portion of the substrate assembly surface;

forming a support film over the at least one conductive material;

forming a fill material over at least a portion of the support film, wherein the fill material at least fills the opening;

removing at least the fill material and the support film outside of the opening to at least the at least one conductive material by planarization;

etching the at least one conductive material outside of the opening to at least the surface of the substrate assembly;

removing the fill material within the opening; and removing the support film within the opening.

6. The method of claim 5, wherein etching the at least one conductive material outside of the opening comprises at least one of wet etching and dry etching the at least one conductive material to at least the surface of the substrate assembly.

7. The method of claim 5, wherein the at least one conductive material comprises at least one Group VIII metal.

8. The method of claim 5, wherein removing the fill material within the opening comprises removing the fill material using at least one of a wet etch and dry etch.

9. The method of claim 8, wherein the fill material is formed of a material that is removed at a rate faster than the material at the surface of the substrate assembly during removal of the fill material from within the opening using at least one of a wet etch and dry etch.

10. The method of claim 5, wherein removing the support film within the opening comprises removing the support film using at least one of a wet etch and dry etch.

11. The method of claim 10, wherein the support film is formed of a material that is removed at a rate faster than the material at the surface of the substrate assembly during removal of the support film from within the opening using at least one of a wet etch and dry etch.

12. A method for use in forming a capacitor, the method comprising:

providing a substrate assembly including an opening defined through an upper surface thereof, wherein the opening is defined by a bottom surface and at least one side wall extending therefrom to the upper surface;

forming a first electrode on the bottom surface and the at least one side wall, wherein forming the electrode comprises:

forming at least one conductive material within the opening on the at least one surface defining the opening and on at least a portion of the upper surface of the substrate assembly, forming at least support material over the at least one conductive material, wherein forming at least support material comprises forming a support film over the at least one conductive material, wherein the opening is not completely filled by the support film, removing at least the support material outside of the opening to the at least one conductive material by planarization, wherein removing at least the support material to the at least one conductive material by planarization comprises planarizing the support film outside the opening to the at least one conductive material outside of the opening, removing the at least one conductive material outside the opening to at least the upper surface of the substrate assembly, wherein removing the at least one conductive material outside the opening comprises removing the at least one conductive material outside of the opening to at least the upper surface of the substrate assembly using at least one of a wet etch and a dry etch, and removing the support film within the opening;

providing a dielectric material on at least a portion of the first electrode; and providing a second electrode on at least a portion of the dielectric material.

13. The method of claim 12, wherein the at least one conductive material is formed of at least one Group VIII metal.

14. The method of claim 12, wherein removing the support film within the opening comprises removing the support film using at least one of a wet etch and a dry etch.

15. The method of claim 14, wherein the support film is formed of at least one material selected from the group consisting of silicon nitride, silicon oxynitride, an oxide material, and spin on glass.

16. A method for use in forming a capacitor, the method comprising:

providing a substrate assembly including an opening defined through an upper surface thereof, wherein the opening is defined by a bottom surface and at least one side wall extending therefrom to the upper surface;

forming a first electrode on the bottom surface and the at least one side wall, wherein forming the electrode comprises:

forming at least one conductive material within the opening on the at least one surface defining the opening and on at least a portion of the upper surface of the substrate assembly, forming a support film over the at least one conductive material, forming a fill material over at least a portion of the support film, wherein the fill material at least fills the opening, removing at least the fill material and the support film outside of the opening to at least the at least one conductive material by planarization, etching the at least one conductive material outside of the opening to at least the surface of the substrate assembly, removing the fill material within the opening, and removing the support film within the opening;

providing a dielectric material on at least a portion of the first electrode; and providing a second electrode on at least a portion of the dielectric material.

17. The method of claim 16, wherein etching the at least one conductive material outside of the opening comprises at least one of dry etching and wet etching the at least one conductive material to at least the surface of the substrate assembly.

18. The method of claim 16, wherein removing the fill material within the opening comprises removing the fill material using at least one of a wet etch and dry etch.

19. The method of claim 16, wherein the at least one conductive material is formed of at least one Group VIII metal.

20. The method of claim 16, wherein removing the support film within the opening comprises removing the support film using at least one of a wet etch and dry etch.

21. The method of claim 20, wherein the support film is formed of at least one material selected from the group consisting of silicon nitride, silicon oxynitride, an oxide material, and spin on glass.

22. A method of providing a conductive material in an opening, the method comprising:

providing a substrate assembly having at least an upper surface;

providing an opening defined through the upper surface of the substrate assembly, wherein the opening is defined by at least one surface;

forming a stack of at least one conductive material, a support film, and a fill material within the opening and on at least a portion of the upper surface, wherein the opening is entirely filled by the stack;

removing at least the fill material outside of the opening;

removing the support film outside of the opening, wherein removing the support film outside of the opening comprises removing the support film outside of the opening by planarization;

removing the at least one conductive material outside of the opening, wherein removing the at least one conductive material outside of the opening comprises removing the at least one conductive material outside of the opening to at least the upper surface of the substrate assembly by at least one of wet etching and dry etching;

removing the fill material within the opening; and removing the support film within the opening.

23. The method of claim 22, wherein removing the fill material within the opening comprises removing the fill material using at least one of a wet etch and a dry etch.

24. The method of claim 22, wherein removing the support film within the opening comprises removing the support film using at least one of a wet etch and a dry etch.

25. The method of claim 22, wherein the at least one conductive material comprises at least one Group VIII metal.

26. A method of providing a conductive material in an opening, the method comprising:

providing a substrate assembly having at least an upper surface;

providing an opening defined through the upper surface of the substrate assembly, wherein the opening is defined by at least one surface;

forming a stack of at least one conductive material, a support film, and a fill material within the opening and on at least a portion of the upper surface, wherein the opening is entirely filled by the stack;

removing at least the fill material outside of the opening;

removing the support film outside of the opening, wherein removing the support film outside of the opening comprises wet etching the support film outside of the opening;

removing the at least one conductive material outside of the opening, wherein removing the at least one conductive material outside of the opening comprises at least one of wet etching and dry etching the at least one conductive material outside of the opening to at least the upper surface of the substrate assembly;

removing the fill material within the opening; and removing the support film within the opening.

27. A method of providing a conductive material in an opening, the method comprising:

providing a substrate assembly having at least one surface;

providing an opening defined through the surface of the substrate assembly, wherein the opening is defined by at least one surface;

forming at least one conductive material within the opening on the at least one surface defining the opening and on at least a portion of the substrate assembly surface;

forming a support film over the at least one conductive material;

forming a fill material over at least a portion of the support film, wherein the fill material at least fills the opening;

removing at least the fill material outside of the opening by planarization;

removing the support film outside of the opening by planarization;

removing the at least one conductive material outside of the opening to at least the surface of the substrate assembly by at least one of wet etching and dry etching;

removing the fill material within the opening; and removing the support film within the opening.

28. A method of providing a conductive material in an opening, the method comprising:

providing a substrate assembly having at least one surface;

providing an opening defined through the surface of the substrate assembly, wherein the opening is defined by at least one surface;

forming at least one conductive material within the opening on the at least one surface defining the opening and on at least a portion of the substrate assembly surface;

forming a support film over the at least one conductive material;

forming a fill material over at least a portion of the support film, wherein the fill material at least fills the opening;

removing at least the fill material outside of the opening by planarization;

removing the support film outside of the opening by dry etching;

removing the at least one conductive material outside of the opening to at least the surface of the substrate assembly by at least one of wet etching and dry etching;

removing the fill material within the opening; and removing the support film within the opening.

29. The method of claim 28, wherein removing the fill material within the opening comprises removing the fill material using at least one of a wet etch and a dry etch.

30. The method of claim 28, wherein removing the support film within the opening comprises removing the support film using at least one of a wet etch and a dry etch.

31. The method of claim 28, wherein the support film is formed of at least one material selected from the group consisting of silicon nitride, silicon oxynitride, an oxide material, and spin on glass.

32. The method of claim 28, wherein the fill material is formed of a resist material.

33. The method of claim 28, wherein the at least one conductive material comprises at least one Group VIII metal.

34. The method of claim 33, wherein the at least one conductive material comprises platinum.

35. A method of providing a conductive material in an opening, the method comprising:

providing a substrate assembly having at least one surface;

providing an opening defined through the surface of the substrate assembly, wherein the opening is defined by at least one surface;

forming at least one conductive material within the opening on the at least one surface defining the opening and on at least a portion of the substrate assembly surface;

forming a support film over the at least one conductive material;

forming a fill material over at least a portion of the support film, wherein the fill material at least fills the opening;

removing at least the fill material outside of the opening by planarization;

removing the support film outside of the opening by wet etching;
removing the at least one conductive material outside of the opening to at least the surface of the substrate assembly by at least one of wet etching and dry etching;
removing the fill material within the opening; and
removing the support film within the opening.

36. The method of claim 35, wherein removing the fill material within the opening comprises removing the fill material using at least one of a wet etch and a dry etch.

37. The method of claim 35, wherein removing the support film within the opening comprises removing the support film using at least one of a wet etch and a dry etch.

38. The method of claim 35, wherein the support film is formed of at least one material selected from the group consisting of silicon nitride, silicon oxynitride, an oxide material, and spin on glass.

39. The method of claim 35, wherein the fill material is formed of a resist material.

40. The method of claim 35, wherein the at least one conductive material comprises at least one Group VIII metal.

41. The method of claim 40, wherein the at least one conductive material comprises platinum.

42. A method for use in forming a capacitor, the method comprising:
providing a substrate assembly including an opening defined through an upper surface thereof, wherein the opening is defined by a bottom surface and at least one side wall extending therefrom to the upper surface;
forming first electrode on the bottom surface and the at least one side wall, wherein forming the electrode comprises:
forming at least one conductive material within the opening on the bottom surface and the at least one side wall defining the opening and on at least a portion of the upper surface of the substrate assembly,
forming a support film over the at least one conductive material,
forming a fill material over at least a portion of the support film, wherein the fill material at least fills the opening,
removing at least the fill material outside of the opening by planarization,
removing at support film outside of the opening by planarization,
removing the at least one conductive material outside of the opening to at least the upper surface of the substrate assembly by at least one of wet etching and dry etching,
removing the fill material within the opening, and
removing the support film within the opening;
providing a dielectric material on at least a portion of the first electrode; and
providing a second electrode on at least a portion of the dielectric material.

43. A method for use in forming a capacitor, the method comprising:
providing a substrate assembly including an opening defined through an upper surface thereof, wherein the opening is defined by a bottom surface and at least one side wall extending therefrom to the upper surface;
forming first electrode on the bottom surface and the at least one side wall, wherein forming the electrode comprises:
forming at least one conductive material within the opening on the bottom surface and the at least one side wall defining the opening and on at least a portion of the upper surface of the substrate assembly,
forming a support film over the at least one conductive material,
forming a fill material over at least a portion of the support film, wherein the fill material at least fills the opening,
removing at least the fill material outside of the opening by planarization,
removing the support film outside of the opening by dry etching,
removing the at least one conductive material outside of the opening to at least the upper surface of the substrate assembly by at least one of wet etching and dry etching,
removing the fill material within the opening, and
removing the support film within the opening;
providing a dielectric material on at least a portion of the first electrode; and
providing a second electrode on at least a portion of the dielectric material.

44. The method of claim 43, wherein removing the fill material within the opening comprises removing the fill material using at least one of a wet etch and a dry etch.

45. The method of claim 43, wherein removing the support film within the opening comprises removing the support film using at least one of a wet etch and a dry etch.

46. The method of claim 43, wherein the support film is formed of at least one material selected from the group consisting of silicon nitride, silicon oxynitride, an oxide material, and spin on glass.

47. The method of claim 43, wherein the fill material is formed of a resist material.

48. The method of claim 43, wherein the at least one conductive material comprises at least one Group VIII metal.

49. The method of claim 48, wherein the at least one conductive material comprises platinum.

50. A method for use in forming a capacitor, the method comprising:
providing a substrate assembly including an opening defined through an upper surface thereof, wherein the opening is defined by a bottom surface and at least one side wall extending therefrom to the upper surface;
forming first electrode on the bottom surface and the at least one side wall, wherein forming the electrode comprises:
forming at least one conductive material within the opening on the bottom surface and the at least one side wall defining the opening and on at least a portion of the upper surface of the substrate assembly,
forming a support film over the at least one conductive material,
forming a fill material over at least a portion of the support film, wherein the fill material at least fills the opening,
removing at least the fill material outside of the opening by planarization,
removing the support film outside of the opening by wet etching,
removing the at least one conductive material outside of the opening to at least the upper surface of the substrate assembly by at least one of wet etching and dry etching, removing the fill material within the opening, and
removing the support film within the opening;
providing a dielectric material on at least a portion of the first electrode; and
providing a second electrode on at least a portion of the dielectric material.

51. The method of claim 50, wherein removing the fill material within the opening comprises removing the fill material using at least one of a wet etch and a dry etch.

52. The method of claim 50, wherein removing the support film within the opening comprises removing the support film using at least one of a wet etch and a dry etch.

53. The method of claim 50, wherein the support film is formed of at least one material selected from the group consisting of silicon nitride, silicon oxynitride, an oxide material, and spin on glass.

54. The method of claim 50, wherein the fill material is formed of a resist material.

55. The method of claim 50, wherein the at least one conductive material comprises at least one Group VIII metal.

56. The method of claim 55, wherein the at least one conductive material comprises platinum.

57. A method of providing a conductive material in an opening, the method comprising:
providing a substrate assembly having at least one surface;
providing an opening defined through the surface of the substrate assembly, wherein the opening is defined by at least one surface;
forming at least one conductive material within the opening on the at least one surface defining the opening and on at least a portion of the substrate assembly surface, wherein the at least one conductive material comprises platinum;
forming a support film over the at least one conductive material;
forming a fill material over at least a portion of the support film, wherein the fill material at least fills the opening;
removing at least the fill material outside of the opening by planarization;
removing the support film outside of the opening;
removing the at least one conductive material outside of the opening;
removing the fill material within the opening; and
removing the support film within the opening.

58. The method of claim 57, wherein removing the fill material within the opening comprises removing the fill material using a least one of a wet etch and a dry etch.

59. The method of claim 57, wherein the fill material is formed of a resist material.

60. The method of claim 57, wherein removing the support film outside of the opening and removing the at least one conductive material outside of the opening comprises removing the support film and the at least one conductive material outside of the opening to at least the surface of the substrate assembly by planarization.

61. The method of claim 60, wherein removing the fill material within the opening comprises removing the fill material using at least one of a wet etch and a dry etch.

62. The method of claim 60, wherein removing the support film within the opening comprises removing the support film using at least one of a wet etch and a dry etch.

63. The method of claim 57, wherein the support film is formed of at least one material selected from the group consisting of silicon nitride; silicon oxynitride, an oxide material, and spin on glass.

64. The method of claim 63, wherein the support film is formed of an oxide material.

65. A method for use in forming a capacitor, the method comprising:
providing a substrate assembly including an opening defined through an upper surface thereof, wherein the opening is defined by a bottom surface and at least one side wall extending therefrom to the upper surface;
forming first electrode on the bottom surface and the at least one side wall, wherein forming the electrode comprises:
forming at least one conductive material within the opening on the bottom surface and the at least one side wall defining the opening and on at least a portion of the upper surface of the substrate assembly, wherein the at least one conductive material comprises platinum.
forming a support film over the at least one conductive material,
forming a fill material over at least a portion of the support film, wherein the fill material at least fills the opening,
removing at least the fill material outside of the opening by planarization,
removing the support film outside of the opening,
removing the at least one conductive material outside of the opening,
removing the fill material within the opening, and
removing the support film within the opening;
providing a dielectric material on at least a portion of the first electrode; and
providing a second electrode on at least a portion of the dielectric material.

66. The method of claim 65, wherein removing the support film outside of the opening and removing the at least one conductive material outside of the opening comprises removing the support film and the at least one conductive material outside of the opening to at least the upper surface of the substrate assembly by planarization.

67. The method of claim 66, wherein removing the fill material within the opening comprises removing the fill material using at least one of a wet etch and a dry etch.

68. The method of claim 66, wherein removing the support film within the opening comprises removing the support film using at least one of a wet etch and a dry etch.

69. A method for use in forming a capacitor, the method comprising:
providing a substrate assembly including an opening defined through an upper surface thereof wherein the opening is defined by a bottom surface and at least one side wall extending therefrom to the upper surface;
forming a first electrode on the bottom surface and the at least one side wall, wherein forming the electrode comprises:
forming at least one conductive material within the opening on the at least one surface defining the opening and on at least a portion of the upper surface of the substrate assembly, wherein the at least one conductive material comprises platinum,
forming at least support material over the at least one conductive material, wherein forming at least support material comprises:
forming a support film over the at least one conductive material; and forming a fill material over at least a portion of the support film, wherein the fill material at least fills the opening, removing at least the support material and the at least one conductive material comprising platinum outside of the opening to at least the upper surface of the substrate assembly by planarization, wherein planarizing at least the support material and the at least one conductive material to at least the upper surface of the substrate assembly comprises planarizing at least the fill material outside of the opening, the support film outside of the opening and the at least one conductive material outside of the opening to at least the upper surface of the substrate assembly, and removing the support material within the opening;

providing a dielectric material on at least a portion of the first electrode; and providing a second electrode on at least a portion of the dielectric material.

70. The method of claim 69, wherein removing the fill material within the opening comprises removing the fill material using at least one of a wet etch and a dry etch.

71. The method of claim 69, wherein removing the support film within the opening comprises removing the support film using at least one of a wet etch and a dry etch.

* * * * *